US012635136B2

(12) United States Patent
Park et al.

(10) Patent No.: US 12,635,136 B2
(45) Date of Patent: May 19, 2026

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventors: Mi Seong Park, Icheon-si (KR); In Su Park, Icheon-si (KR); Jung Shik Jang, Icheon-si (KR); Seok Min Jeon, Icheon-si (KR); Won Geun Choi, Icheon-si (KR); Jung Dal Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 387 days.

(21) Appl. No.: 18/337,307

(22) Filed: Jun. 19, 2023

(65) Prior Publication Data

US 2024/0196609 A1 Jun. 13, 2024

(30) Foreign Application Priority Data

Dec. 9, 2022 (KR) ........................ 10-2022-0171655

(51) Int. Cl.
| | |
|---|---|
| *H10B 43/27* | (2023.01) |
| *G11C 16/04* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *G11C 16/0483* (2013.01); *H10B 41/10* (2023.02); *H10B 41/27* (2023.02); *H10B 43/10* (2023.02)

(58) Field of Classification Search
CPC ......... H10B 43/27; H10B 51/10; H10B 43/10
See application file for complete search history.

(56) References Cited

U.S. PATENT DOCUMENTS

| | | | |
|---|---|---|---|
| 11,980,035 B2 * | 5/2024 | Lin ..................... | H10D 30/701 |
| 2020/0083248 A1 * | 3/2020 | Uchida ................. | H10B 43/35 |

FOREIGN PATENT DOCUMENTS

| | | |
|---|---|---|
| CN | 112437984 A | 3/2021 |
| KR | 1020170031290 A | 3/2017 |
| KR | 1020180008959 A | 1/2018 |

* cited by examiner

*Primary Examiner* — William B Partridge
*Assistant Examiner* — Mehek Ahmed
(74) *Attorney, Agent, or Firm* — WILLIAM PARK AND ASSOCIATES LTD.

(57) ABSTRACT

The present disclosure includes a semiconductor memory device and a method of manufacturing the semiconductor memory device. The semiconductor memory device includes a stack including a plurality of conductive layers stacked to be spaced apart in a first direction, an opening in the stack extending in the first direction and having an elliptical shape in a plan view, and a first channel pattern and a second channel pattern spaced apart from each other in a second direction toward which a major axis of the elliptical shape faces in the opening, the first channel pattern and the second channel pattern extending in the first direction. Each of the first channel pattern and the second channel pattern includes a central portion overlapping with the major axis of the elliptical shape and bent portions extending away from the central portion.

10 Claims, 26 Drawing Sheets

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2022-0171655 filed on Dec. 9, 2022, in the Korean Intellectual Property Office, the entire disclosure of which is incorporated by reference herein.

BACKGROUND

1. Technical Field

The present disclosure relates to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device may include a plurality of memory cells capable of storing data. A plurality of memory cells of a three-dimensional semiconductor memory device may be arranged in a three-dimension. In the three-dimensional semiconductor memory device, the plurality of memory cells may be connected in series.

SUMMARY

According to an embodiment of the present disclosure, a semiconductor memory device may include a stack including a plurality of conductive layers stacked to be spaced apart in a first direction, an opening in the stack extending in the first direction and having an elliptical shape in a plan view, a first channel pattern and a second channel pattern spaced apart from each other in a second direction toward which a major axis of the elliptical shape faces in the opening, the first channel pattern and the second channel pattern extending in the first direction, and a memory layer between the stack and each of the first channel pattern and the second channel pattern. Each of the first channel pattern and the second channel pattern may include a central portion overlapping with the major axis of the elliptical shape and a bent portion extending along an inner wall of the memory layer and extending away from the central portion, and a thickness of the bent portion of each of the first channel pattern and the second channel pattern may decrease as a distance from the central portion increases.

According to an embodiment of the present disclosure, a method of manufacturing a semiconductor memory device may include forming a preliminary stack including a plurality of first material layers and a plurality of second material layers alternately disposed in a first direction, forming an opening in the preliminary stack extending in the first direction and having an elliptical shape in a plan view, forming a memory layer along an inner wall of the opening, and forming a channel layer along an inner wall of the memory layer. The channel layer may have a first thickness in a second direction toward which a major axis of the elliptical shape faces and a second thickness in a third direction toward which a minor axis of the elliptical shape faces. The first thickness is greater than the second thickness. The method may further include separating the channel layer into a first channel pattern and a second channel pattern spaced apart in the second direction inside the opening.

BRIEF DESCRIPTION OF THE DRAWINGS

FIGS. 4A and 4B are cross-sectional views illustrating a first structure and a second structure of a semiconductor memory device according to embodiments of the present disclosure.

FIGS. 6A, 6B, and 6C are diagrams illustrating a cell plug according to an embodiment of the present disclosure.

FIGS. 8A, 8B, and 8C are cross-sectional views illustrating a connection structure between a doped semiconductor structure and a channel layer according to embodiments of the present disclosure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Various embodiments of the present disclosure are directed to a semiconductor memory device and a method of manufacturing the semiconductor memory device capable of improving reliability.

Figure 1:
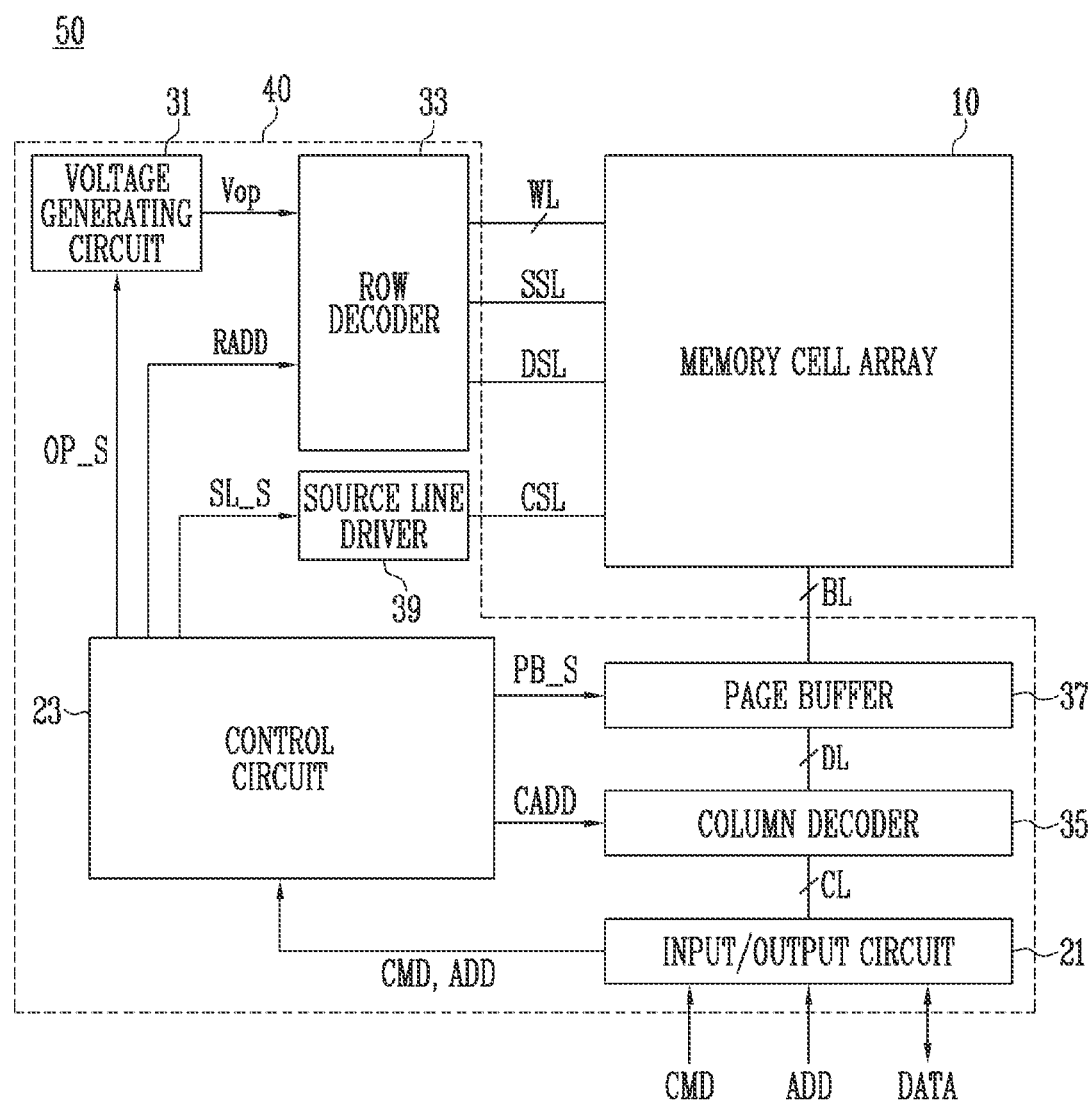
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 50 may include a peripheral circuit 40 and a memory cell array 10.

The peripheral circuit 40 may be configured to perform a program operation for storing data in the memory cell array 10, a read operation for outputting data stored in the memory cell array 10, and an erase operation for erasing data stored in the memory cell array 10. As an embodiment, the peripheral circuit 40 may include an input/output circuit 21, a control circuit 23, a voltage generating circuit 31, a row decoder 33, a column decoder 35, a page buffer 37, and a source line driver 39.

The peripheral circuit 40 may be connected to the memory cell array 10 through a common source line CSL, a bit line BL, a drain select line DSL, a word line WL, and a source select line SSL.

The input/output circuit 21 may transmit a command CMD and an address ADD, received from an external device (for example, a memory controller) of the semiconductor memory device 50, to the control circuit 23. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operation voltages Vop used for the program operation, the read operation, and the erase operation in response to the operation signal OP_S.

The row decoder 33 may transmit the operation voltages Vop to the drain select line DSL, the word line WL, and the source select line SSL in response to the row address RADD.

In response to the column address CADD, the column decoder 35 may transmit the data DATA input from the input/output circuit 21 to the page buffer 37 or may transmit the data DATA stored in the page buffer 37 to the input/output circuit 21. The column decoder 35 may exchange the data DATA with the input/output circuit 21 through a column line CL. The column decoder 35 may exchange the data DATA with the page buffer 37 through a data line DL.

The page buffer 37 may store read data received through the bit line BL in response to the page buffer control signal PB_S. The page buffer 37 may sense a voltage or a current of the bit line BL during the read operation.

The source line driver 39 may control a voltage applied to the common source line CSL in response to the source line control signal SL_S.

The memory cell array 10 may include a plurality of memory blocks. Each of the memory blocks may include a plurality of memory cells. Each of the memory cells may be a nonvolatile memory cell. As an embodiment, each of the memory cells may be a NAND flash memory cell.

Figure 2:
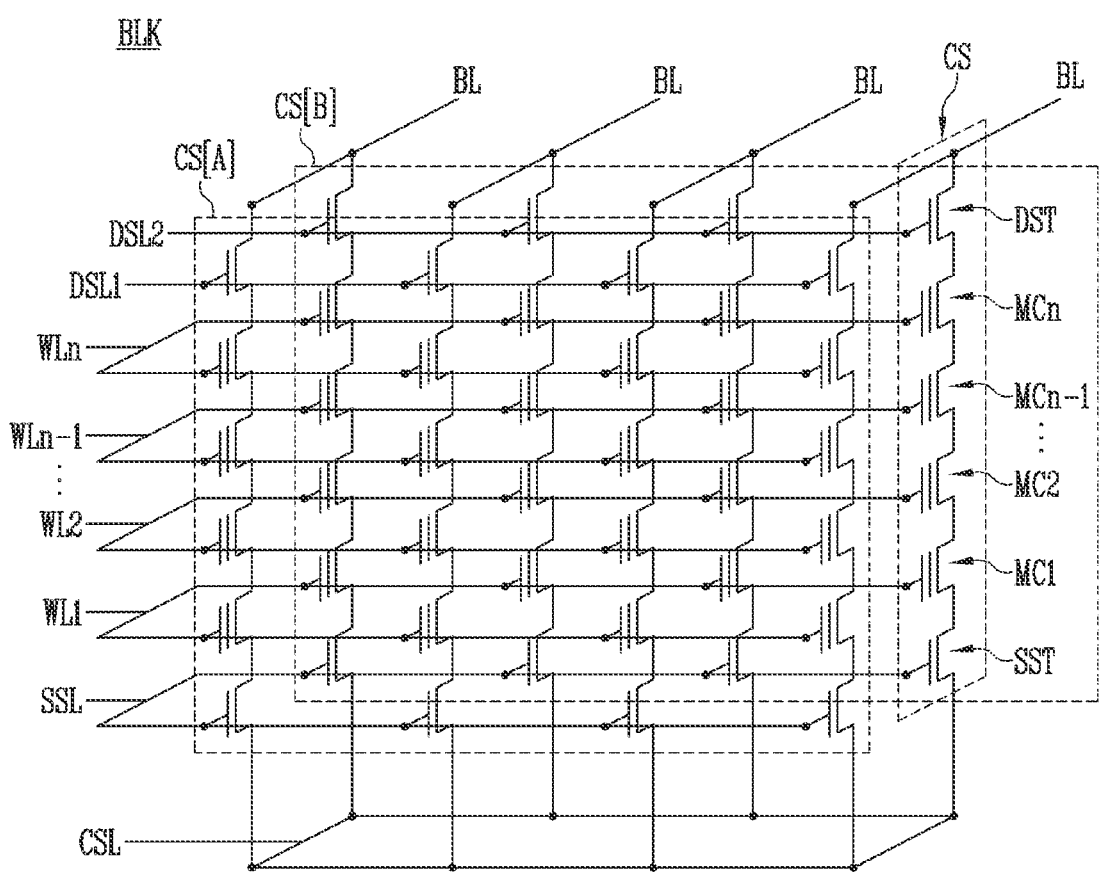
FIG. 2 is a circuit diagram of a memory block according to an embodiment of the present disclosure.

FIG. 2 is a circuit diagram of a memory block according to an embodiment of the present disclosure.

Referring to FIG. 2, the memory block BLK may include a plurality of memory cell strings CS. The memory block BLK may be included in the memory cell array 10, shown in FIG. 1.

Each memory cell string CS may include at least one source select transistor SST, a plurality of memory cells MC1 to MCn, and at least one drain select transistor DST. The plurality of memory cells MC1 to MCn may be connected in series between the source select transistor SST and the drain select transistor DST. The source select transistor SST, the plurality of memory cells MC1 to MCn, and the drain select transistor DST may be connected in series by a channel pattern.

The plurality of memory cell strings CS may be connected in parallel to the common source line CSL. Each memory cell string CS may be connected to one bit line corresponding thereto among a plurality of bit lines BL. The common source line CSL and the plurality of bit lines BL may be connected to a plurality of channel patterns of the plurality of cell strings CS.

The plurality of memory cells MC1 to MCn of the memory cell string CS may be connected to the common source line CSL via the source select transistor SST. The plurality of memory cells MC1 to MCn of the memory cell string CS may be connected to a bit line BL corresponding thereto via the drain select transistor DST.

The memory cell string CS may be connected to the source select line SSL, a plurality of word lines WL1 to WLn, and a drain select line DSL1 or DSL2. The source select line SSL may serve as a gate electrode of the source select transistor SST. The plurality of word lines WL1 to WLn may serve as gate electrodes of the plurality of memory cells MC1 to MCn. The drain select line DSL1 or DSL2 may serve as a gate electrode of the drain select transistor DST.

Each of the plurality of word lines WL1 to WLn may be configured to control the plurality of memory cell strings CS. The plurality of memory cell strings CS may be divided into two or more string groups. Each bit line BL may be connected to different string groups. As an embodiment, a first memory cell string of a first string group CS[A] and a second memory cell string of a second string group CS[B] may be connected to each bit line BL. The first string group CS[A] and the second string group CS[B] may be individually controlled by drain select lines separated from each other or source select lines separated from each other. As an embodiment, the first string group CS[A] may be connected to the first drain select line DSL1, and the second string group CS[B] may be connected to the second drain select line DSL2. At this time, the first string group CS[A] and the second string group CS[B] may be connected to the same source select line SSL. An embodiment of the present disclosure is not limited thereto. Although not shown in the drawing, as an embodiment, the first memory cell string of the first string group CS[A] and the second memory cell string of the second string group CS[B] connected to the same bit line BL may be connected to the same drain select line and may be respectively connected to first and second source select lines separated from each other. Although not shown in the drawing, as an embodiment, the first memory cell string of the first string group CS[A] and the second memory cell string of the second string group CS[B] connected to the same bit line BL may be respectively connected to the first and second drain select lines separated from each other and may be respectively connected to the first and second source select lines separated from each other.

An operation voltage for precharging the channel pattern of the memory cell string CS corresponding thereto may be applied to each bit line BL. The bit line BL may be connected to the channel pattern of the memory cell string CS through a bit line contact.

An operation voltage for discharging a channel potential of the memory cell string CS may be applied to the common source line CSL.

Figure 3A:
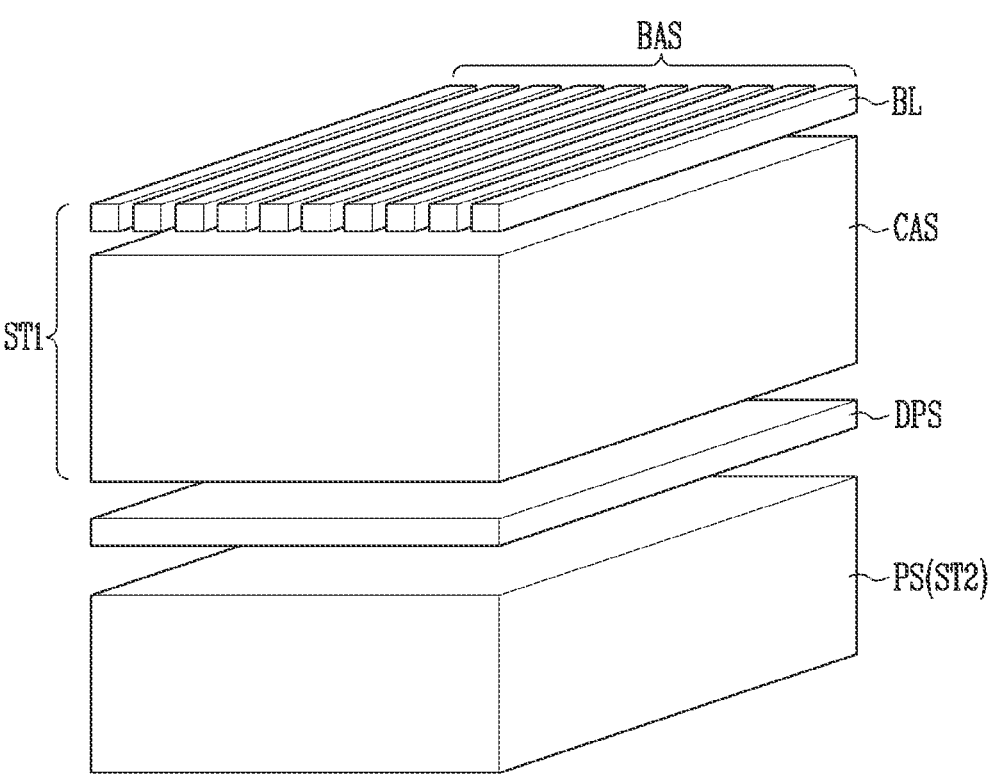
FIGS. 3A and 3B are diagrams illustrating a vertical arrangement of a semiconductor memory device according to embodiments of the present disclosure.
Figure 3B:
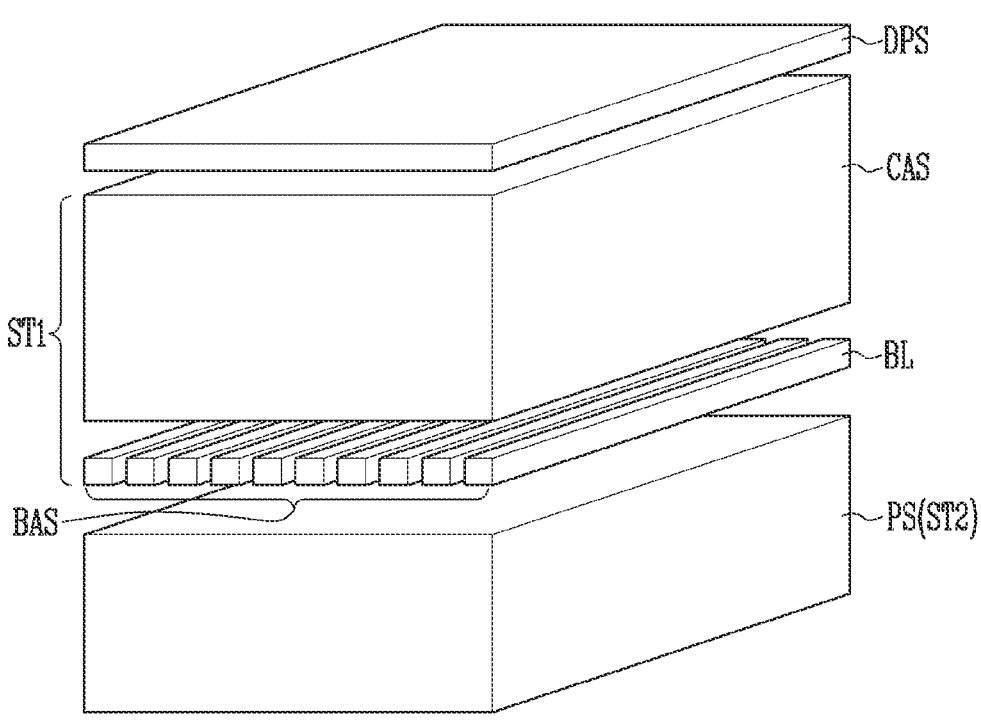

FIGS. 3A and 3B are diagrams illustrating a vertical arrangement of a semiconductor memory device according to embodiments of the present disclosure.

Referring to FIGS. 3A and 3B, the semiconductor memory device may include a first structure ST1, a second structure ST2, and a doped semiconductor structure DPS. The first structure ST1 may include a cell array structure CAS and a bit line array structure BAS, and the second structure ST2 may include a peripheral circuit structure PS.

The bit line array structure BAS may include a plurality of bit lines BL. Each bit line BL may correspond to the bit line, shown in FIG. 1 or 2.

The cell array structure CAS may be disposed between the bit line array structure BAS and the doped semiconductor structure DPS. The cell array structure CAS may be included in the memory cell array 10, shown in FIG. 1, and may include the plurality of memory cell strings CS, shown in FIG. 2.

The doped semiconductor structure DPS may be connected to the common source line CSL, shown in FIG. 1 or 2. The common source line CSL, shown in FIG. 1 or 2, may be connected to the channel pattern of the memory cell string via the doped semiconductor structure DPS. The doped semiconductor structure DPS may include at least one of an n-type impurity and a p-type impurity.

The peripheral circuit structure PS may include an area overlapping the doped semiconductor structure DPS, the cell array structure CAS, and the bit line array structure BAS. The peripheral circuit structure PS may include the plurality of transistors, the capacitor, the resistor, and the like configuring the peripheral circuit 40, shown in FIG. 1.

The peripheral circuit structure PS may be adjacent to the doped semiconductor structure DPS as shown in FIG. 3A or may be adjacent to the bit line array structure BAS as shown in FIG. 3B.

Although not shown in the drawing, each of the first structure ST1 and the second structure ST2 may include at least one of a plurality of interconnections, a plurality of contacts, and a plurality of conductive bonding pads for electrical connection.

Figure 4A:
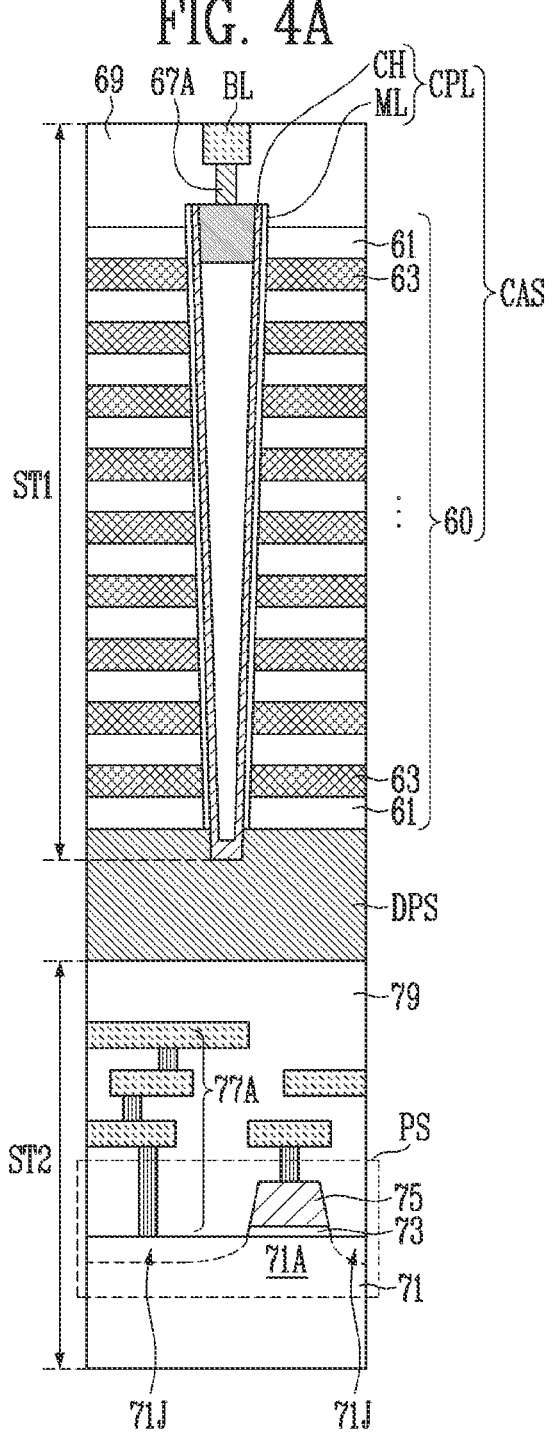
Figure 4B:
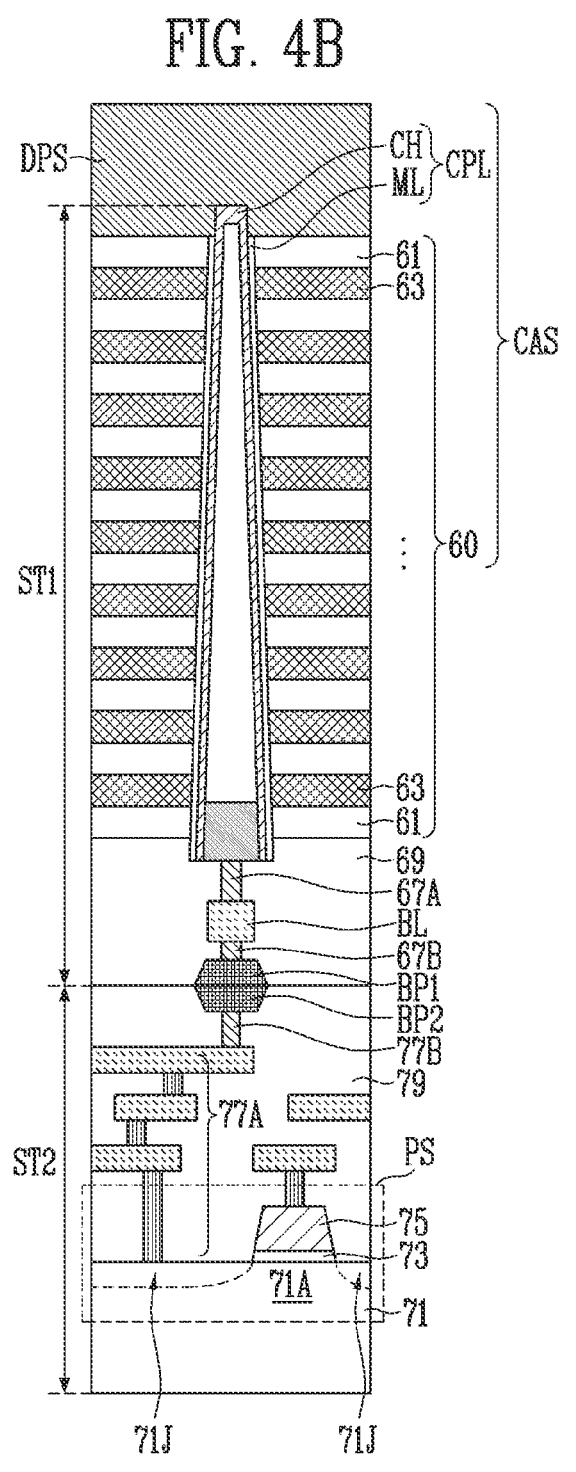

FIGS. 4A and 4B are cross-sectional views illustrating a first structure and a second structure of a semiconductor memory device according to embodiments of the present disclosure.

Referring to FIGS. 4A and 4B, a first structure ST1 may include a cell array structure CAS, a first insulating structure 69, a bit line contact 67A, and a bit line BL. The cell array structure CAS and the bit line BL may correspond to the cell array structure and the bit line described with reference to FIGS. 3A and 3B. The cell array structure CAS may include a stack 60 between a doped semiconductor structure DPS and the bit line BL, and a cell plug CPL passing through the stack 60. The doped semiconductor structure DPS may correspond to the doped semiconductor structure described with reference to FIGS. 3A and 3B.

The stack 60 may include a plurality of insulating layers 61 and a plurality of conductive layers 63 that are alternately stacked in a direction in which the doped semiconductor structure DPS faces the bit line BL. The plurality of conductive layers 63 may form the source select line SSL, the drain select line DSL1 or DSL2, and the plurality of word lines WL1 to WLn, shown in FIG. 2.

The cell plug CPL may include a channel pattern CH and a memory layer ML between the channel pattern CH and the stack 60. The channel pattern CH may serve as a channel area of the memory cell string CS, shown in FIG. 2. Some areas of the memory layer ML may serve as data storage areas of the plurality of memory cells MC1 to MCn, shown in FIG. 2.

The channel pattern CH may include an end area connected to the doped semiconductor structure DPS. The channel pattern CH may be connected to the bit line BL via the bit line contact 67A. The bit line contact 67A and the bit line BL may be disposed inside the first insulating structure 69.

The second structure ST2 may include a semiconductor substrate 71, a peripheral circuit structure PS, a second insulating structure 79, and a plurality of interconnections 77A. The peripheral circuit structure PS may correspond to the peripheral circuit structure described with reference to FIGS. 3A and 3B.

The semiconductor substrate 71 may include an active area 71A partitioned by an element isolation layer (not shown). The peripheral circuit structure PS may include a transistor. The transistor may include a gate insulating layer 73 and a gate electrode 75 stacked on the active area 71A of the semiconductor substrate 71, and source/drain junctions 71J formed in the active area 71A on both sides of the gate electrode 75. The plurality of interconnections 77A may include sub interconnections individually connected to the gate electrode 75 and the source/drain junctions 71J.

The semiconductor substrate 71 and the peripheral circuit structure PS may be covered with the second insulating structure 79, and the plurality of interconnections 77A may be disposed inside the second insulating structure 79.

Referring to FIG. 4A, a process of forming the doped semiconductor structure DPS and a process of forming the first structure ST1 may be performed over the second structure ST2. As an embodiment, after forming the doped semiconductor structure DPS over the second structure ST2, the process of forming the first structure ST1 may be performed over the doped semiconductor structure DPS.

Referring to FIG. 4B, a process of forming the first structure ST1 and a process of forming the second structure ST2 may be individually performed. At this time, the first structure ST1 may further include a first contact 67B and a first conductive bonding pad BP1 disposed in the first insulating structure 69, and the second structure ST2 may further include a second contact 77B and a second conductive bonding pad BP2 disposed in the second insulating structure 79. Through a bonding process, the first conductive bonding pad BP1 of the first structure ST1 provided through a process may be connected to the second conductive bonding pad BP2 of the second structure ST2 provided through another process that is different from the process of providing the first conductive bonding pad BP1 of the first structure ST1. The doped semiconductor structure DPS may be provided after the bonding process.

The first conductive bonding pad BP1 may be electrically connected to any one of the bit line BL connected to the memory cell string or the conductive layers 63 connected to the memory cell string via the first contact 67B. The second conductive bonding pad BP2 may be electrically connected to any one of the elements configuring the peripheral circuit structure PS via the second contact 77B. FIG. 4B representatively illustrates the first contact 67B, the first conductive bonding pad BP1, the second conductive bonding pad BP2, and the second contact 77B provided for electrical connection between a transistor configuring the page buffer 37 shown in FIG. 1 and the bit line BL. In this case, the bit line BL may be electrically connected to the first conductive bonding pad BP1 through the first contact 67B, and one sub interconnection, among the plurality of interconnections 77A, may be electrically connected to the second conductive bonding pad BP2 through the second contact 77B.

Figure 5:
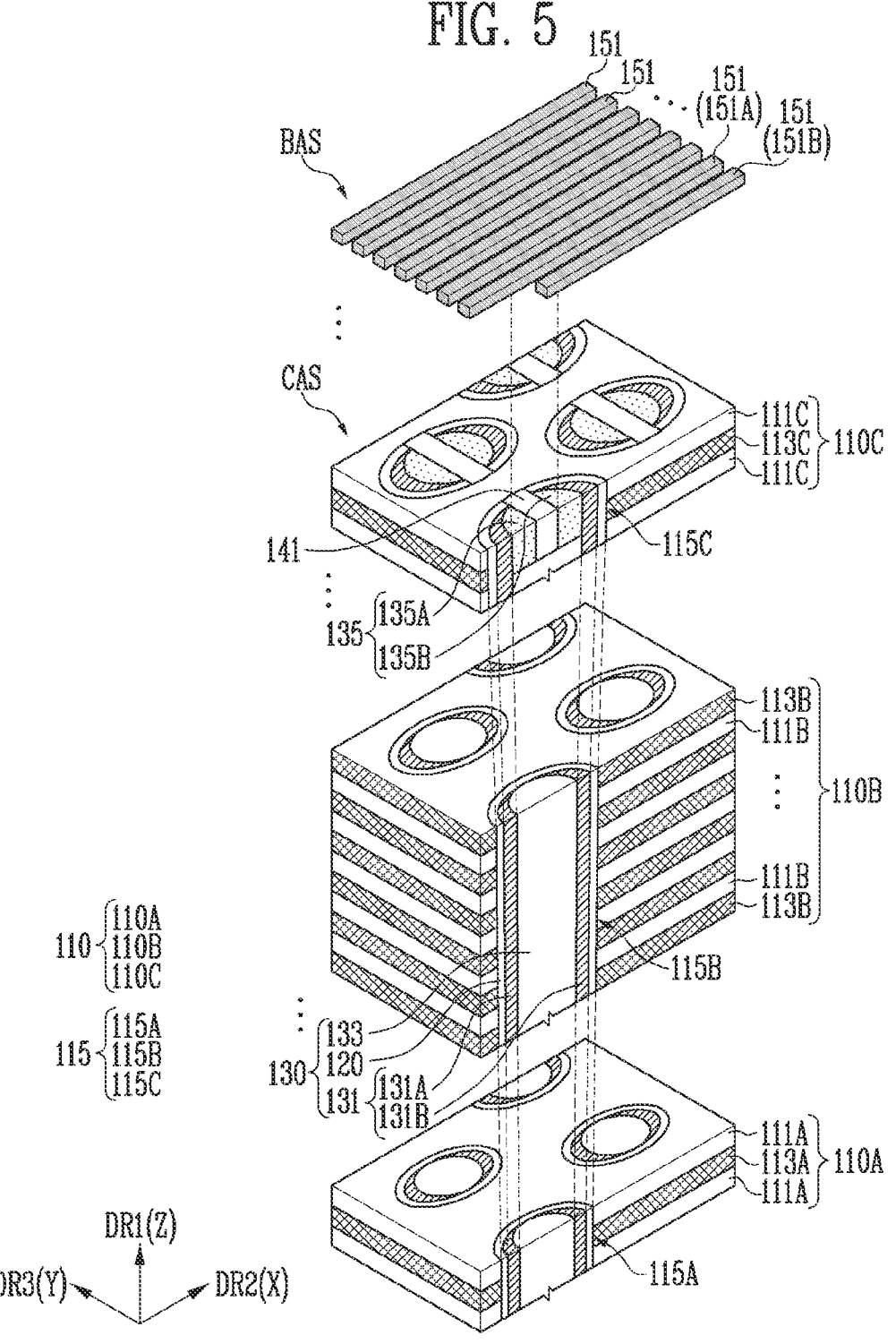
FIG. 5 is a diagram illustrating a semiconductor memory device according to an embodiment of the present disclosure.

FIG. 5 is a diagram illustrating a semiconductor memory device according to an embodiment of the present disclosure.

Referring to FIG. 5, a cell array structure CAS may include a gate stack 110, a plurality of openings 115 passing through the gate stack 110, and a plurality of cell plugs 130 respectively disposed inside the plurality of openings 115. A bit line array structure BAS may include a plurality of bit lines 151. The cell array structure CAS and bit line array structure BAS, shown in FIG. 5, may correspond to the cell array structure and the bit line array structure described with reference to FIGS. 3A and 3B. The cell array structure CAS and each bit line BL, shown in FIG. 5, may correspond to the cell array structure and the bit line described with reference to FIGS. 4A and 4B.

The gate stack 110 may include a first stack 110A, a second stack 110B, and a third stack 110C stacked in a first direction DR1. Each opening 115 may include a first portion 115A inside the first stack 110A, a second portion 115B inside the second stack 110B, and a third portion 115C inside the third stack 110C. FIG. 5 illustrates an exploded perspective view of the first stack 110A, the second stack 110B, and the third stack 110C for convenience of recognition, but the second stack 110B may be disposed to be in contact with the first stack 110A, and the third stack 110C may be disposed to be in contact with the second stack 110B.

The first stack 110A may include at least one first interlayer insulating layer 111A and at least one first conductive layer 113A alternately disposed in the first direction DR1. The first conductive layer 113A may serve as the source select line SSL, shown in FIG. 2.

The second stack 110B may include a plurality of second conductive layers 113B disposed to be spaced apart in the first direction DR1. The plurality of second conductive layers 113B may serve as the plurality of word lines WL1 to WLn, shown in FIG. 2. The second stack 110B may further include a plurality of second conductive layers 113B and a plurality of second interlayer insulating layers 111B alternately disposed in the first direction DR1.

The third stack 110C may include at least one third interlayer insulating layer 111C and at least one third conductive layer 113C alternately disposed in the first direction DR1. The third conductive layer 113C may serve as the drain select line DSL1 or DSL2, shown in FIG. 2.

Each of the first interlayer insulating layer 111A, the second interlayer insulating layer 111B, and the third interlayer insulating layer 111C may include an insulating material, such as a silicon oxide layer or a silicon oxynitride layer.

Each of the first conductive layer 113A, the second conductive layer 113B, and the third conductive layer 113C may be formed in a flat plate shape extending in the second direction DR2 and the third direction DR3. Each of the first conductive layer 113A, the second conductive layer 113B, and the third conductive layer 113C may include at least one of a doped semiconductor layer, a metal layer, and a conductive metal nitride layer. The doped semiconductor layer may include a doped silicon layer. The metal layer may include tungsten, copper, molybdenum, or the like. The conductive metal nitride layer may include titanium nitride, tantalum nitride, and the like.

The first direction DR1, the second direction DR2, and the third direction DR3 may be defined as directions in which axes cross. As an embodiment, the second direction DR2 may be an X-axis direction, the third direction DR3 may be a Y-axis direction, and the first direction DR1 may be a Z-axis direction.

Inner diameters of each opening 115 may be different from each other in the second direction DR2 and the third direction DR3. Hereinafter, an embodiment of the present disclosure will be described based on the opening 115 having a minimum inner diameter in the third direction DR3 and a maximum inner diameter in the second direction DR2.

Each cell plug 130 may include a memory layer 120, a channel layer 131, and a core insulating structure 133. Each cell plug 130 may further include a doped capping layer 135 and a separation structure 141.

The memory layer 120 may extend along an inner wall of the opening 115. As an embodiment, the memory layer 120 may successively extend along inner walls of each of the first portion 115A, the second portion 115B, and the third portion 115C of the opening 115. The memory layer 120 may be formed in a hollow type. A partial area of the memory layer 120 between the cell plug 130 and the first conductive layer 113A, provided as the source select line, may serve as a gate insulating layer. A partial area of the memory layer 120 between the cell plug 130 and each second conductive layer 113B, provided as the word line, may serve as a data storage area. A partial area of the memory layer 120 between the cell plug 130 and the third conductive layer 113C, provided as the drain select line, may serve as a gate insulating layer.

The channel layer 131 may extend along an inner wall of the memory layer 120. The channel layer 131 may be formed of a semiconductor material that may serve as a channel area of the memory cell string. As an embodiment, the channel layer 131 may include silicon (Si), germanium (Ge), or a mixture thereof. The channel layer 131 may successively extend along the inner walls of each of the first portion 115A, the second portion 115B, and the third portion 115C of the opening 115. The channel layer 131 may be separated into a first channel pattern 131A and a second channel pattern 131B in the opening 115. The first channel pattern 131A and the second channel pattern 131B may be spaced apart from each other in the second direction DR2. The first channel pattern 131A and the second channel pattern 131B may be formed in a structure symmetrical to each other.

The core insulating structure 133 may be disposed in the opening 115 and may be disposed between the first channel pattern 131A and the second channel pattern 131B. The core insulating structure 133 may include various insulating materials. The core insulating structure 133 may extend through the first portion 115A of the opening 115 and the second portion 115B of the opening 115.

An end area of the core insulating structure 133, the doped capping layer 135, and the separation structure 141 may be disposed in the third portion 115C of the opening 115. The doped capping layer 135 may be formed of a semiconductor layer including at least one of an n-type impurity and a p-type impurity. As an embodiment, the doped capping layer 135 may include an n-type impurity as a majority carrier. An end area of the channel layer 131 adjacent to the doped capping layer 135 may be doped with the same impurity as the doped capping layer 135.

The doped capping layer 135 may be separated into a first doped capping pattern 135A and a second doped capping pattern 135B by the separation structure 141. The first doped capping pattern 135A and the second doped capping pattern 135B may be spaced apart in the second direction DR2. The first doped capping pattern 135A may contact the first channel pattern 131A, and the second doped capping pattern 135B may contact the second channel pattern 131B.

The plurality of bit lines 151 may electrically connect the first channel pattern 131A and the second channel pattern 131B to the page buffer 37, shown in FIG. 1. The plurality of bit lines 151 may include a first bit line 151A connected to the first channel pattern 131A and a second bit line 151B connected to the second channel pattern 131B. The first bit line 151A may be electrically connected to the first channel pattern 131A via the first doped capping pattern 135A, and the second bit line 151B may be electrically connected to the second channel pattern 131B via the second doped capping pattern 135B.

A pair of first and second sub memory cell strings may be defined along the first channel pattern 131A and the second channel pattern 131B inside each opening 115. The pair of first and second sub memory cell strings may be separated from each other by the core insulating structure 133. The first sub memory cell string may include a plurality of memory cells connected in series along the first channel pattern 131A, and the second sub memory cell string may include a plurality of memory cells connected in series along the second channel pattern 131B.

A cross section of each of the first channel pattern 131A and the second channel pattern 131B may be defined on a plane parallel to a flat plate formed by each of the first conductive layer 113A, the second conductive layer 113B, and the third conductive layer 113C. Each of the first channel pattern 131A and the second channel pattern 131B may have a curved shaped of cross-sectional structure. From a planar perspective, a thickness of each of the first channel pattern 131A and the second channel pattern 131B may decrease toward an end area. A planar shape of each opening 115 may be controlled to have an elliptical shape so that the first channel pattern 131A and the second channel pattern 131B may be easily formed in the above-described structure.

Figure 6A:
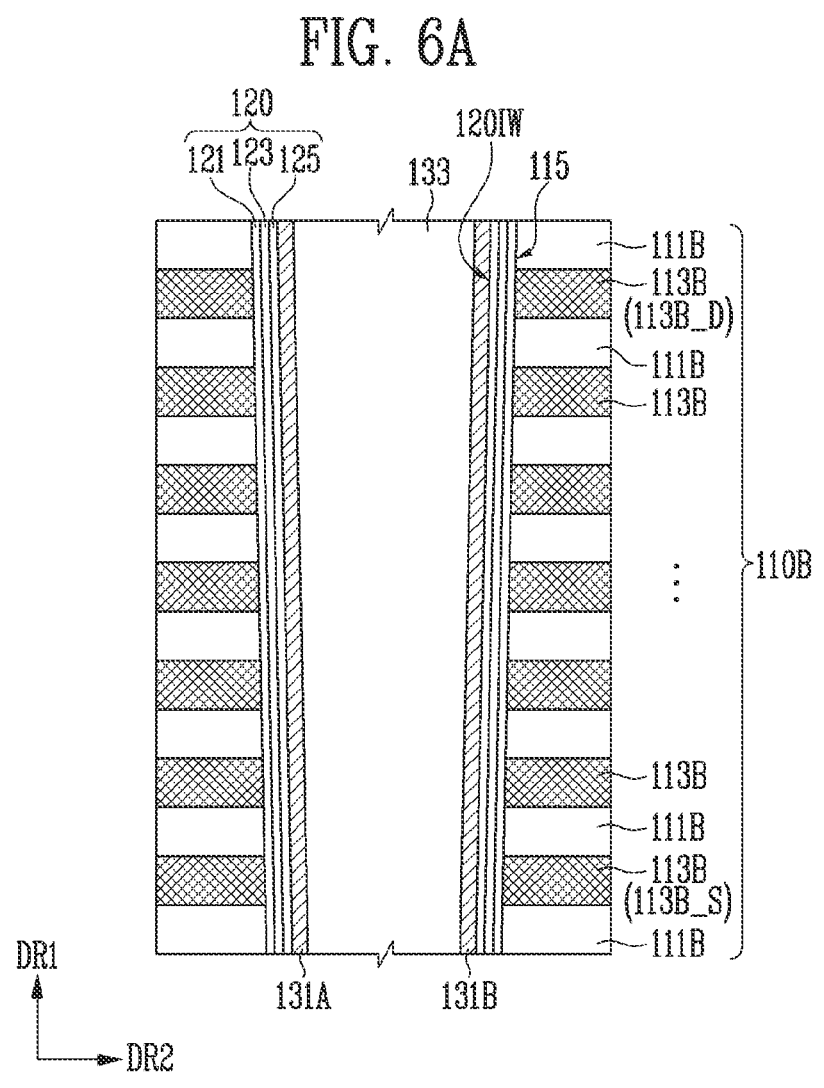
Figure 6B:
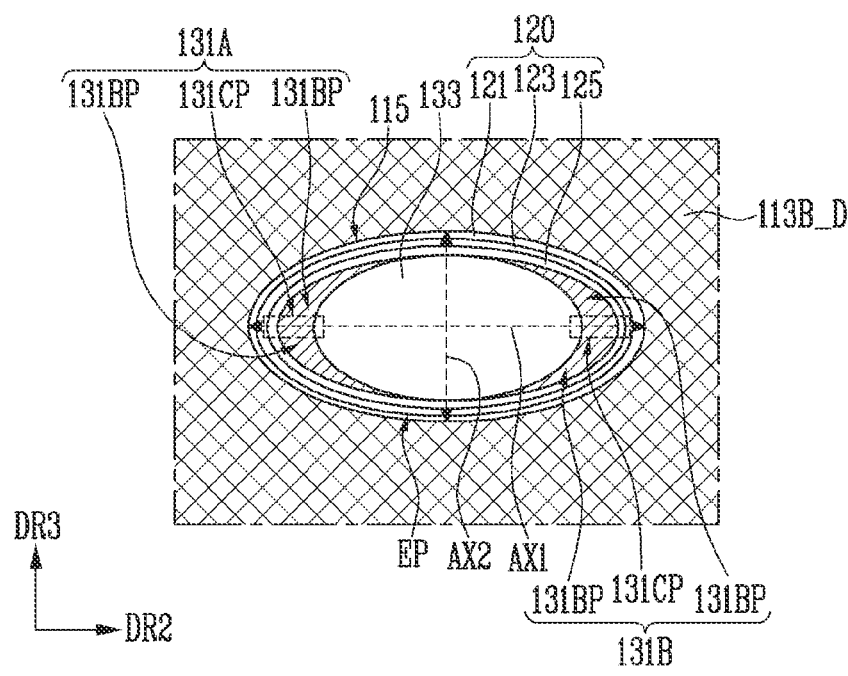
Figure 6C:
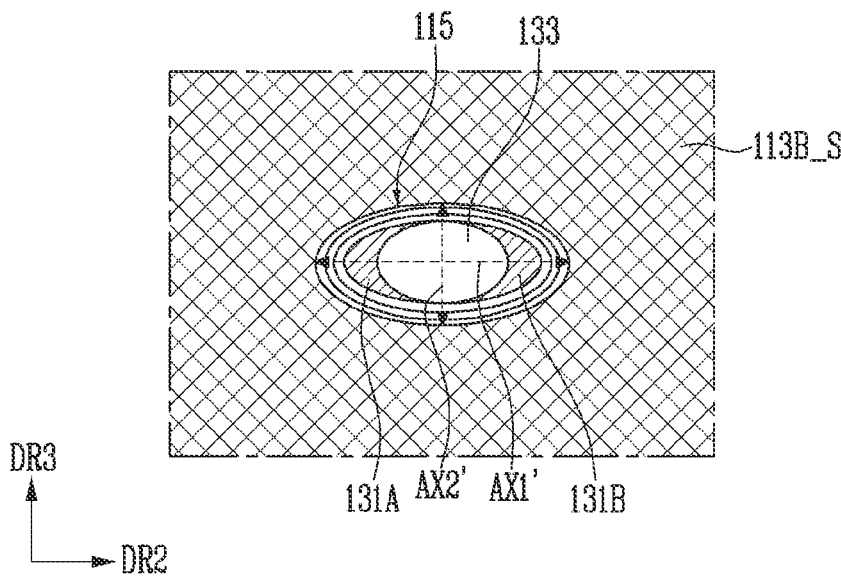

FIGS. 6A, 6B, and 6C are diagrams illustrating a cell plug according to an embodiment of the present disclosure. FIG. 6A is a diagram illustrating a longitudinal cross-sectional structure of a portion of the cell plug 130 disposed inside the second stack 110B, shown in FIG. 5, and FIGS. 6B and 6C are diagrams respectively illustrating cross-sectional structures of the cell plug 130, shown in FIG. 5, at different levels.

Referring to FIGS. 6A to 6C, the plurality of second conductive layers 113B of the second stack 110B may include a source-side second conductive layers 113B_S adjacent to the first stack 110A, shown in FIG. 5, and a drain-side second conductive layer 113B_D adjacent to the third stack 110C, shown in FIG. 5.

The opening 115 may extend in the first direction DR1 in the second stack 110B. The inner diameter of the opening 115 may increase from a first level at which the source-side second conductive layer 113B_S is disposed to a second level at which the drain-side second conductive layer 113B_D is disposed. As a result, an inner diameter of a portion of the opening 115 included in the source-side second conductive layer 113B_S may be narrower than an inner diameter of another portion of the opening 115 included in the drain-side second conductive layer 113B_D.

As described with reference to FIG. 5, the opening 115 may have an elliptical shape in a plan view. A major axis AX1 or AX1' of the elliptical shape may face the second direction DR2, and a minor axis AX2 or AX2' of the elliptical shape may face the third direction DR3 as shown in FIGS. 6B and 6C.

The first channel pattern 131A and the second channel pattern 131B may be spaced apart from each other in the second direction DR2 and may extend in the first direction DR1. Each of the first channel pattern 131A and the second channel pattern 131B may include a central portion 131C and bent portions 131BP. The central portion 131C may overlap with the major axis AX1 or AX1' of the elliptical shape. The bent portions 131BP may extend along an inner wall 120IW of the memory layer 120 in a direction away from both sides of the central portion 131CP. A thickness of the bent portions 131BP may decrease as a distance from the central portion 131CP increases. In other words, the central portion 131CP of each of the first channel pattern 131A and the second channel pattern 131B may be formed to have a thickness greater than that of an end area of each of the first channel pattern 131A and the second channel pattern 131B. Accordingly, when an etching process for separating the first channel pattern 131A and the second channel pattern 131B is performed, a thickness of the central portion 131CP may be secured. Therefore, an operation reliability reduction of the semiconductor memory device due to loss of a thickness of the channel pattern may be improved.

The memory layer 120 may be interposed between each of the first channel pattern 131A and the second channel pattern 131B and the second stack 110B. The memory layer 120 may include a blocking insulating layer 121, a data storage layer 123, and a tunnel insulating layer 125. The blocking insulating layer 121 may be interposed between each of the first channel pattern 131A and the second channel pattern 131B and the second stack 110B. The data storage layer 123 may be interposed between the blocking insulating layer 121 and the tunnel insulating layer 125. The tunnel insulating layer 125 may be interposed between the data storage layer 123 and each of the first channel pattern 131A and the second channel pattern 131B.

The blocking insulating layer 121 may include an insulating material capable of charge blocking. The tunnel insulating layer 125 may include an insulating material capable of charge tunneling. The blocking insulating layer 121 may include an insulating layer having a dielectric constant higher than that of the tunnel insulating layer 125.

The data storage layer 123 may be formed of a material layer capable of storing changed data using Fowler Nordheim tunneling. As an embodiment, the data storage layer 123 may be formed of a charge trap insulating layer, a floating gate layer, or an insulating layer including a conductive nano dot. The charge trap insulating layer may include a silicon nitride layer. The present disclosure is not limited thereto, and the data storage layer 123 may be formed of a material layer capable of storing information based on an operation principle other than Fowler Nordheim tunneling. As an embodiment, the data storage layer 123 may include a phase change material layer, a ferroelectric layer, and the like.

A shape of the end area of each of the first channel pattern 131A and the second channel pattern 131B and a configuration of the core insulating structure 133 are not limited to those shown in FIGS. 6B and 6C and may vary.

FIGS. 7A, 7B, 7C, and 7D are plan views illustrating a cross-sectional structure of a cell plug according to embodiments of the present disclosure. FIGS. 7A, 7B, 7C, and 7D illustrate various cross-sectional structures of the cell plug 130 inside the second stack 110B, shown in FIG. 5.

As an embodiment, as shown in FIGS. 6B, 7A, 7B, and 7D, each of the first channel pattern 131A and the second channel pattern 131B may be a crescent-shaped in a plan view. At this time, an end area EP of the bend portion of each of the first channel pattern 131A and the second channel pattern 131B may be sharply formed.

Figures 7A, 7B:
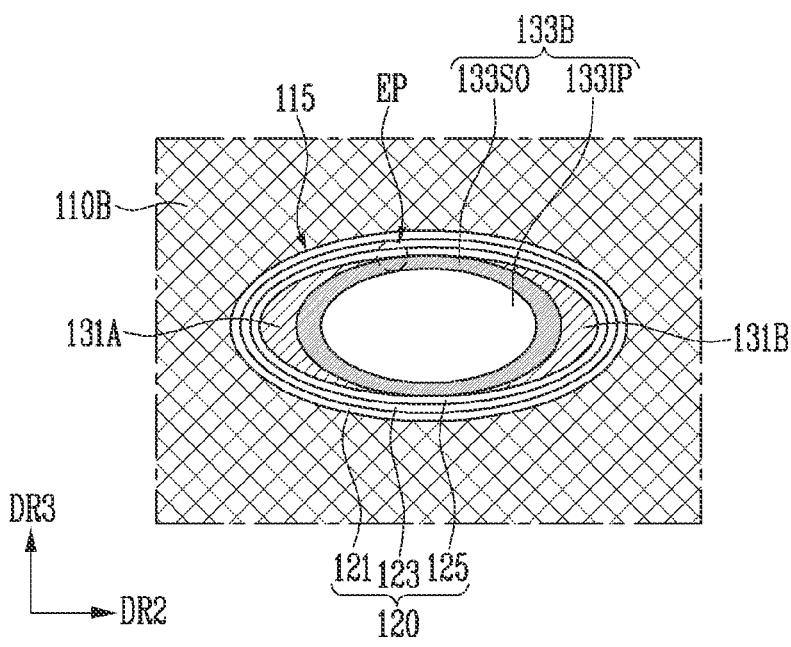
FIGS. 7A, 7B, 7C, and 7D are plan views illustrating a cross-sectional structure of a cell plug according to embodiments of the present disclosure.
Figure 7C:
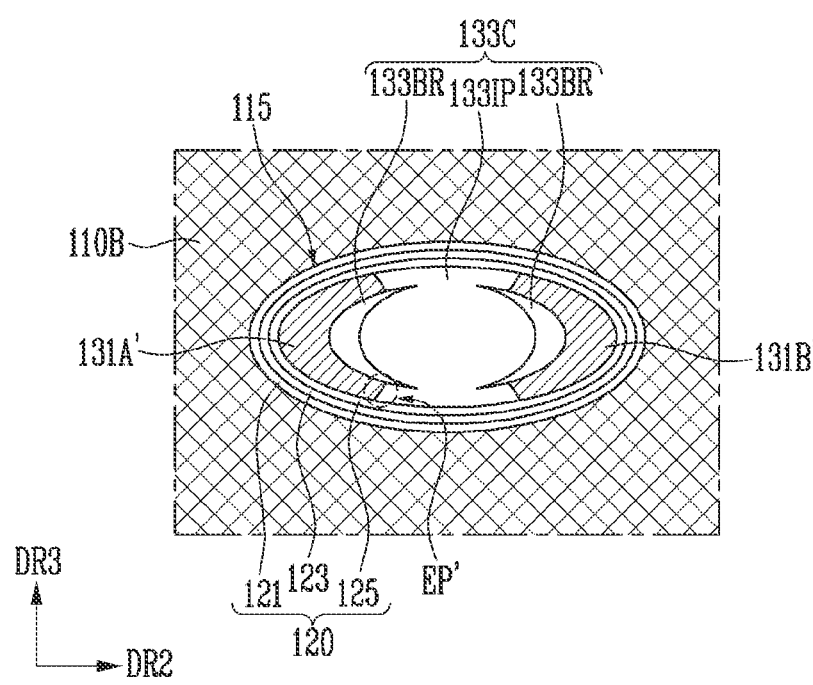

As another embodiment, as shown in FIG. 7C, an end area EP' of a bent portion of each of a first channel pattern 131A' and a second channel pattern 131B' may be bluntly formed. For example, the end area EP' of the bent portion of each of the first channel pattern 131A' and the second channel pattern 131B' may be linearly formed. In this case, because a phenomenon in which an electric field is concentrated to the end area EP' of the bent portion of each of the first channel pattern 131A' and the second channel pattern 131B' may be improved, a leakage current increase due to the concentration of the electric field may be improved.

As an embodiment, as shown in FIG. 6B, 7B, 7C, or 7D, the memory layer 120 may include an area that is in contact with a core insulating structure 133, 133B, 133C, or 133D between the first channel pattern 131A or 131A' and the second channel pattern 131B or 131B'.

As another embodiment, as shown in FIG. 7A, a core insulating structure 133A may pass through at least one of the blocking insulating layer 121, the data storage layer 123, and the tunnel insulating layer 125 of the memory layer 120. FIG. 7A representatively illustrates the core insulating structure 133A extending to pass through each of the blocking insulating layer 121, the data storage layer 123, and the tunnel insulating layer 125 of the memory layer 120. In this case, the memory layer 120 may be separated into a first memory pattern 120A and a second memory pattern 120B by the core insulating structure 133A in the opening 115.

As an embodiment, as shown in FIG. 6B or 7A, the core insulating structure 133 or 133A may be formed of a single insulating material disposed inside the opening 115.

Figure 7D:
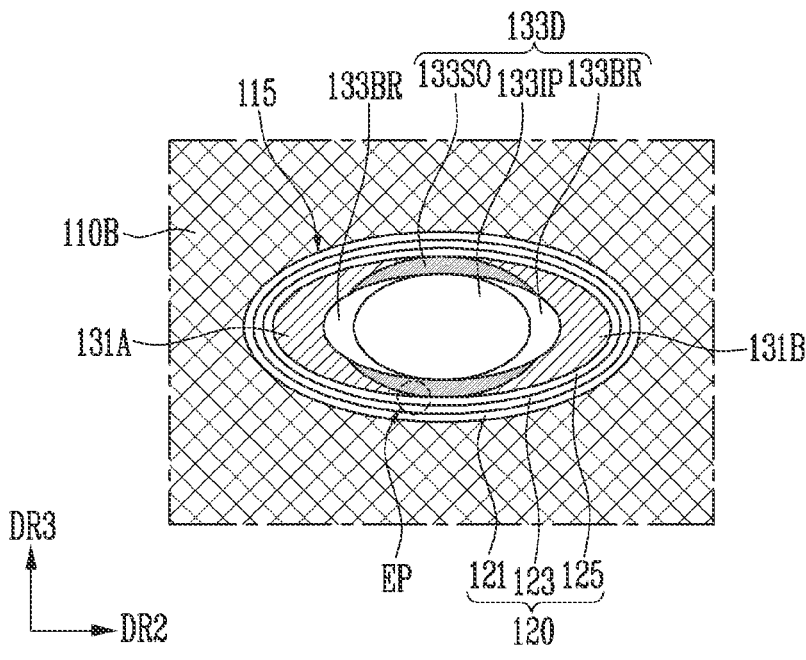

As another embodiment, as shown in FIG. 7B, 7C, or 7D, the core insulating structure 133B, 133C, or 133D may include an insulating pillar 131IP disposed in a central area of the opening 115 and may further include at least one of a semiconductor oxide layer 133SO and a barrier insulating layer 133BR. The barrier insulating layer 133BR may include an insulating material having a physical property different from that of the insulating pillar 131IP. As an embodiment, the barrier insulating layer 133BR may be formed of an oxide denser than the insulating pillar 131IP.

Referring to FIG. 7B, the core insulating structure 133B may include the insulating pillar 131IP and the semiconductor oxide layer 133SO surrounding a sidewall of the insulating pillar 131IP. The semiconductor oxide layer 133SO may be interposed between each of the first channel pattern 131A, the second channel pattern 131B, and the memory layer 120, and the insulating pillar 131IP.

Referring to FIG. 7C, the core insulating structure 133C may include the barrier insulating layer 133BR disposed between the insulating pillar 131IP and each of the first channel patterns 131A' and the second channel patterns 131B'. The barrier insulating layer 133BR may have a crescent shape in a plan view. The insulating pillar 131IP may extend to contact the end area EP' of the bent portion of each of the first channel pattern 131A' and the second channel pattern 131B'.

Referring to FIG. 7D, the core insulating structure 133D may include the insulating pillar 131IP, the barrier insulating layer 133BR, and the semiconductor oxide layer 133SO. The barrier insulating layer 133BR may be disposed between each of the first channel pattern 131A and the second channel pattern 131B and the insulating pillar 131IP. The semiconductor oxide layer 133SO may extend along a portion of a sidewall of the insulating pillar 131IP. The insulating pillar 131IP may include an area contacting the barrier insulating layer 133BR and an area contacting the semiconductor oxide layer 133SO. The sidewall of the insulating pillar 131IP may be surrounded by the barrier insulating layer 133BR and the semiconductor oxide layer 133SO. The barrier insulating layer 133BR may have a crescent shape in a plan view. The semiconductor oxide layer 13350 may extend along a portion of the sidewall of the insulating pillar 131IP opened by the barrier insulating layer 133BR. The semiconductor oxide layer 133SO may extend between the barrier insulating layer 133BR and the end area EP of the bent portion of each of the first channel pattern 131A and the second channel pattern 131B.

A channel layer forming the first channel pattern 131A or 131A' and the second channel pattern 131B or 131B', described above, may be connected to the doped semiconductor structure DPS described with reference to FIGS. 3A and 3B and FIGS. 4A and 4B.

Figure 8A:
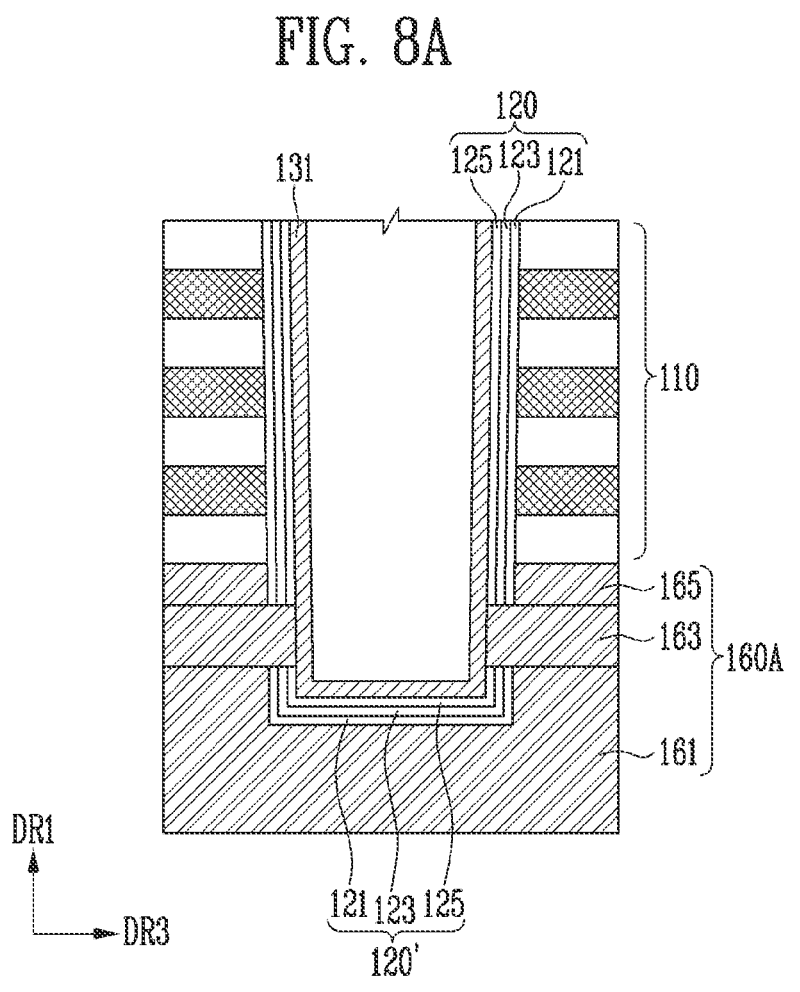
Figure 8B:
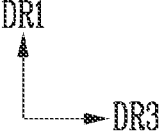
Figure 8C:
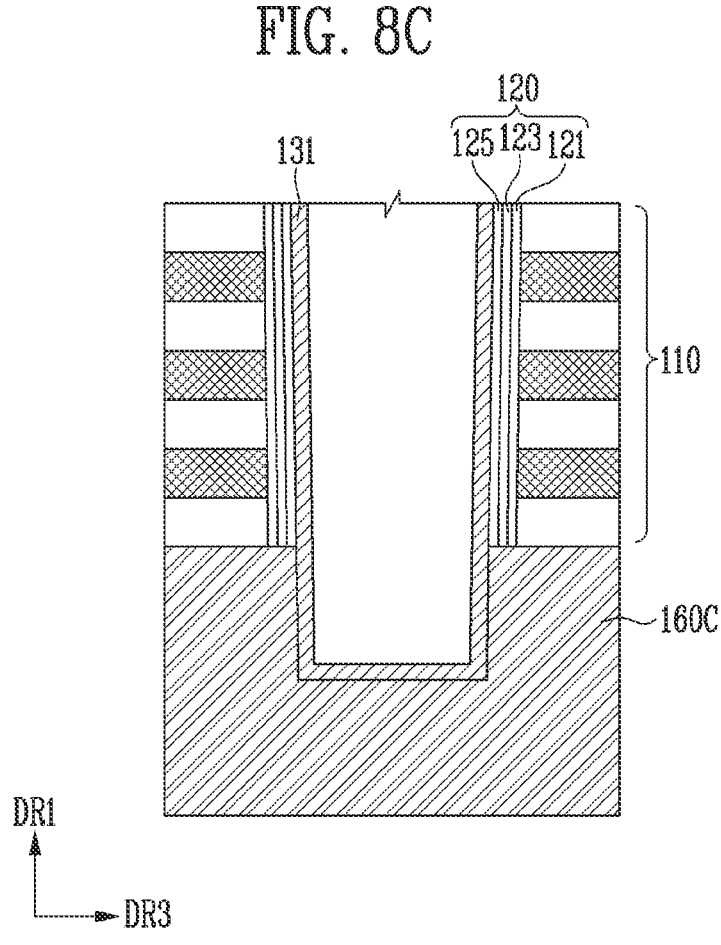

FIGS. 8A, 8B, and 8C are cross-sectional views illustrating a connection structure between a doped semiconductor structure and a channel layer according to embodiments of the present disclosure. Hereinafter, a detailed description of technical features overlapping those of the embodiment described with reference to FIGS. 5 and 6A to 6C is omitted.

Referring to FIGS. 8A to 8C, the channel layer 131 may correspond to the first channel pattern 131A or the second channel pattern 131B, shown in FIGS. 5 and 6A to 6C.

The channel layer 131 may pass through the gate stack 110 over a doped semiconductor structure 160A, 160B, or 160C and may be connected to the doped semiconductor structure 160A, 160B, or 160C. The doped semiconductor structure 160A, 160B, or 160C may include at least one of an n-type impurity and a p-type impurity. More specifically, the doped semiconductor structure 160A, 160B, or 160C may include at least one of a first area including an n-type impurity as a majority carrier and a second area including a p-type impurity as a majority carrier.

Referring to FIG. 8A, the doped semiconductor structure 160A may include a first doped semiconductor layer 161 and a second doped semiconductor layer 163 on the first doped semiconductor layer 161. The doped semiconductor structure 160A may further include a third doped semiconductor layer 165 on the second doped semiconductor layer 163, and the third doped semiconductor layer 165 may be omitted in some cases. Each of the first doped semiconductor layer 161, the second doped semiconductor layer 163, and the third doped semiconductor layer 165 may include an n-type impurity or a p-type impurity as a majority carrier. As an embodiment, the first doped semiconductor layer 161 may include n-type doped polysilicon or p-type doped polysilicon, and each of the second doped semiconductor layer 163 and the third doped semiconductor layer 165 may include n-type doped polysilicon.

The channel layer 131 may pass through the third doped semiconductor layer 165 and may extend into the first doped semiconductor layer 161. The second doped semiconductor layer 163 may extend toward a sidewall of the channel layer 131 to contact the channel layer 131. Each of the blocking insulating layer 121, the data storage layer 123, and the tunnel insulating layer 125 may be separated into the memory layer 120 and a dummy memory layer 120' by the second doped semiconductor layer 163.

Each of the blocking insulating layer 121, the data storage layer 123, and the tunnel insulating layer 125 of the memory layer 120 may be disposed between the gate stack 110 and the channel layer 131 and may extend between the third doped semiconductor layer 165 and the channel layer 131. Each of the blocking insulating layer 121, the data storage layer 123, and the tunnel insulating layer 125 of the dummy memory layer 120' may be interposed between the first doped semiconductor layer 161 and the channel layer 131.

Referring to FIG. 8B, the doped semiconductor structure 160B may include an n-type impurity as a majority carrier. As an embodiment, the doped semiconductor structure 160B may include n-type doped polysilicon.

The channel layer 131 may pass through the blocking insulating layer 121, the data storage layer 123, and the tunnel insulating layer 125 of the memory layer 120 to contact the doped semiconductor structure 160B. At least one of the blocking insulating layer 121, the data storage layer 123, and the tunnel insulating layer 125 may be bent to surround a corner of the channel layer 131.

Referring to FIG. 8C, the doped semiconductor structure 160C may include an n-type impurity as a majority carrier. As an embodiment, the doped semiconductor structure 160C may include n-type doped polysilicon.

The channel layer 131 may protrude into the doped semiconductor structure 160C as opposed to the blocking insulating layer 121, the data storage layer 123, and the tunnel insulating layer 125 of the memory layer 120. The corner of the channel layer 131 may be buried inside the doped semiconductor structure 160C and may directly contact the doped semiconductor structure 160C.

Figure 9A:
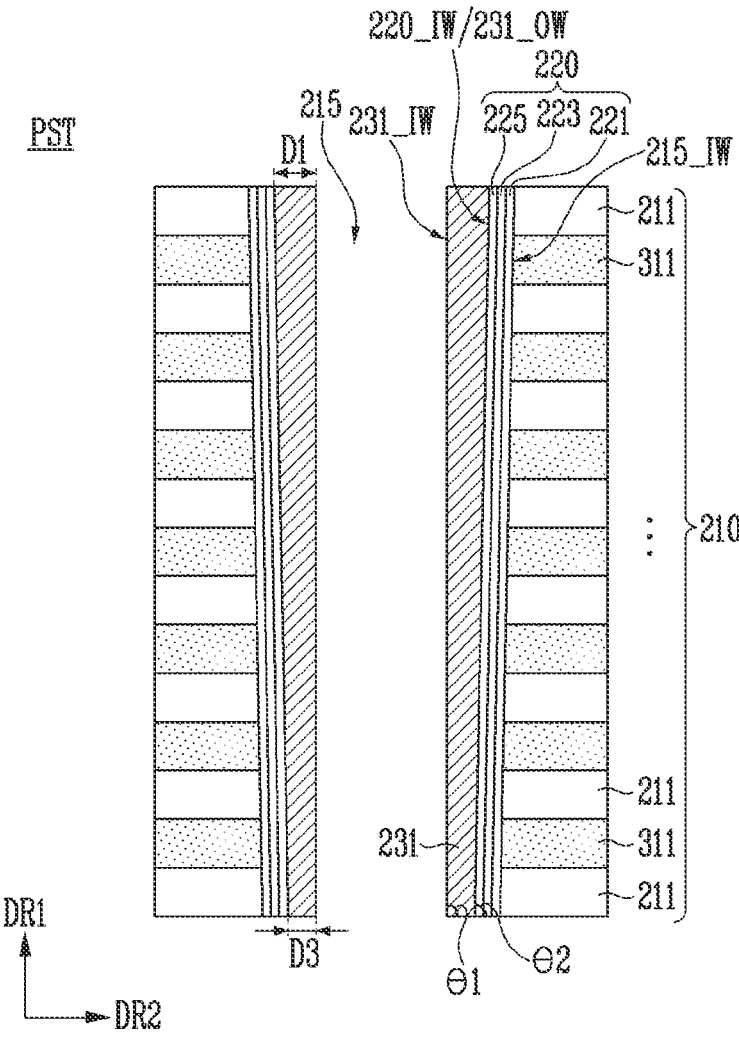
FIGS. 9A, 9B, and 9C are diagrams illustrating a process of forming a preliminary structure according to an embodiment of the present disclosure.
Figure 9B:
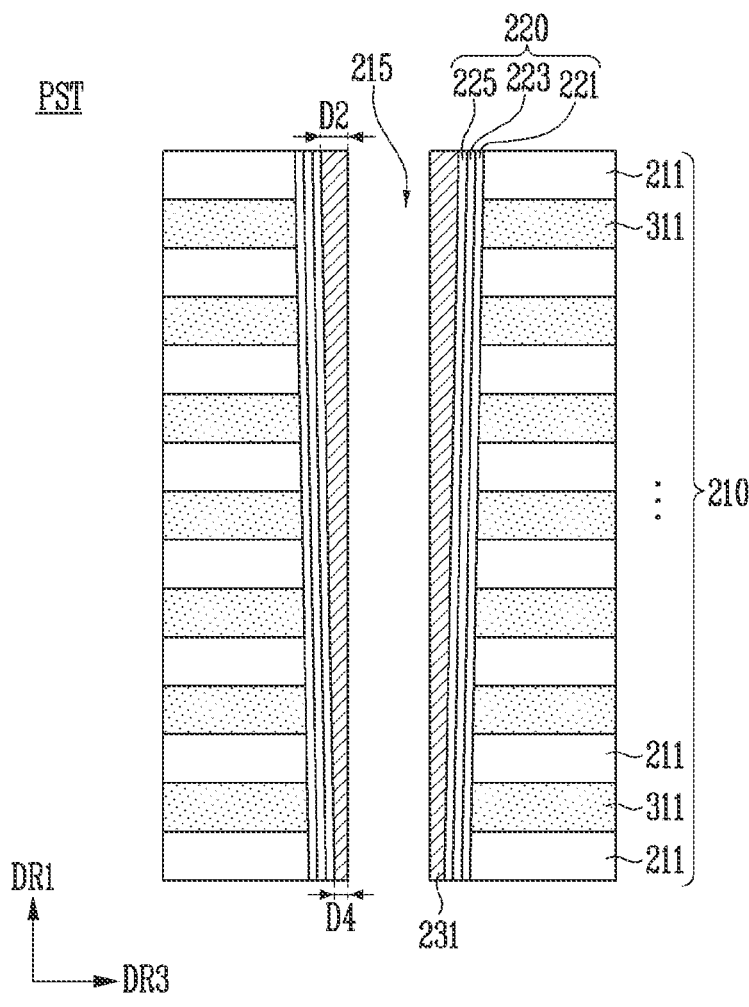
Figure 9C:
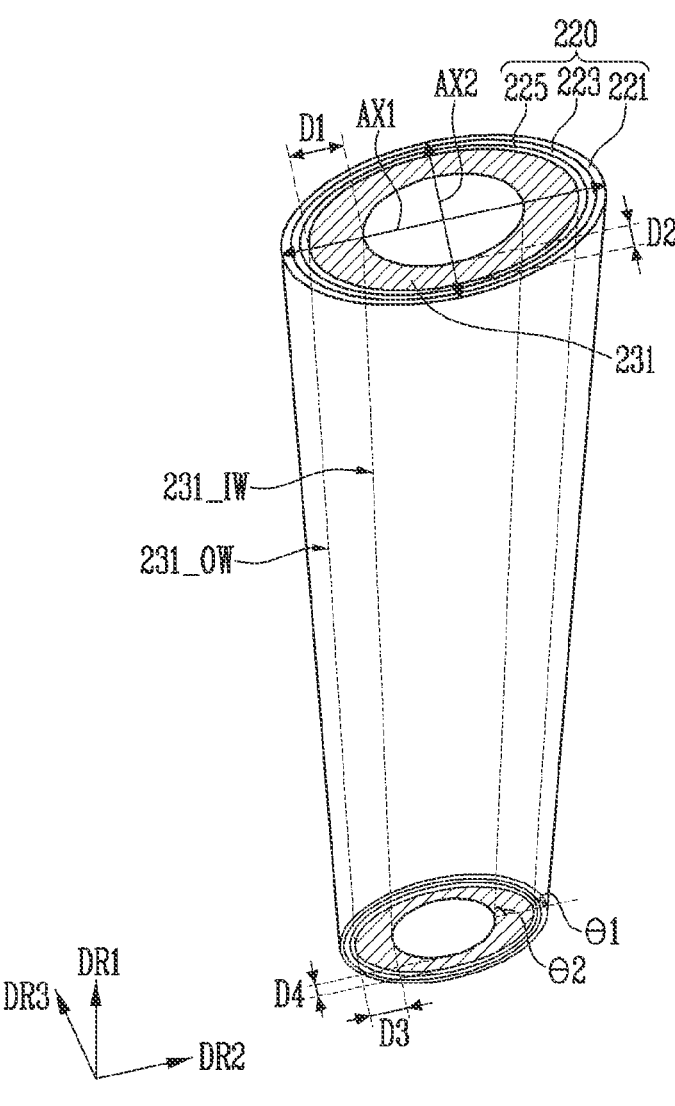

FIGS. 9A, 9B, and 9C are diagrams illustrating a process of forming a preliminary structure according to an embodiment of the present disclosure. FIG. 9A is a cross-sectional view illustrating the preliminary structure PST taken along a major axis AX1, shown in FIG. 9C, and FIG. 9B is a cross-sectional view illustrating the preliminary structure PST taken along a minor axis AX2, shown in FIG. 9C. FIG. 9C is a perspective view illustrating a memory layer 220 and a channel layer 231 of the preliminary structure PST, shown in FIGS. 9A and 9B.

Referring to FIGS. 9A to 9C, the process of forming the preliminary structure PST may include forming a preliminary stack 210 over a lower structure (not shown), forming an opening 215 in the preliminary stack 210, forming the memory layer 220 along an inner wall 215_IW of the opening 215, and forming the channel layer 231 along an inner wall 220_IW of the memory layer 220.

The lower structure (not shown) may be a sacrificial substrate formed of a silicon wafer or the like, a structure including the second structure ST2 and the doped semiconductor structure DPS described with reference to FIG. 4A, or a structure including the second structure ST2 described with reference to FIG. 4A and a preliminary doped semiconductor structure over the second structure ST2. The sacrificial substrate may be subsequently replaced with a doped semiconductor structure 160C as shown in FIG. 8C. A portion of the preliminary doped semiconductor structure may be subsequently replaced with the second doped semiconductor layer 163 as shown in FIG. 8A. The preliminary stack 210 may be formed over the lower structure according to various embodiments described above. The preliminary stack 210 may include a plurality of first material layers 211 and a plurality of second material layers 311 alternately disposed in the first direction DR1.

The plurality of second material layers 311 may be formed of a material having an etch selectivity with respect to the plurality of first material layers 211. As an embodiment, the plurality of first material layers 211 may include an insulating material, such as a silicon oxide layer and a silicon oxynitride layer, and the plurality of second material layers 311 may include a sacrificial insulating layer, such as a silicon nitride layer. The sacrificial insulating layer may be subsequently replaced with a conductive material including at least one of a doped semiconductor layer, a metal layer, and a conductive metal nitride layer. As another embodiment, the plurality of first material layers 211 may include a sacrificial material, such as an undoped silicon layer, and the plurality of second material layers 311 may include a conductive material of doped silicon layers. The sacrificial material may be subsequently replaced with an insulating layer including a silicon oxide layer, a silicon oxynitride layer, or the like.

The plurality of first material layers 211 may be formed of an insulating material, and the plurality of second material layers 311 may be formed of a conductive material. As an embodiment, the plurality of first material layers 211 may include a silicon oxide layer, a silicon oxynitride layer, or the like, and the plurality of second material layers 311 may include at least one of a doped semiconductor layer, a metal layer, and a conductive metal nitride layer.

Forming the opening 215 may include forming a mask pattern (not shown) defining a planar shape of the opening 215 over the preliminary stack 210 and etching the plurality of first material layers 211 and the plurality of second material layers 311 by using the mask pattern as an etch barrier. The opening 215 may pass through the plurality of first material layers 211 and the plurality of second material layers 311. A planar shape of the opening 215 may be formed in an elliptical shape to induce a difference in deposition thickness of the channel layer 231. As an embodiment, the major axis AX1 of the elliptical shape defined by the opening 215 may face the second direction DR2, and the minor axis AX2 of the elliptical shape defined by the opening 215 may face the third direction DR3.

The opening 215 may become narrower toward a lower portion of the preliminary stack 210. Accordingly, an area of the elliptical shape defined at an upper end of the opening 215 may be greater than an area of the elliptical shape defined at a lower end of the opening 215. In addition, an inner wall 215_IW of the opening 215 may be inclined.

The memory layer 220 may include a blocking insulating layer 221, a data storage layer 223, and a tunnel insulating layer 225. The blocking insulating layer 221, the data storage layer 223, and the tunnel insulating layer 225 may include the same materials as the blocking insulating layer 121, the data storage layer 123, and the tunnel insulating layer 125 described with reference to FIGS. 6A to 6C.

The channel layer 231 may include silicon (Si), germanium (Ge), or a mixture thereof. The channel layer 231 may include an outer wall 231_OW facing the memory layer 220 and an inner wall 231_IW facing a central area of the opening 215.

A deposition amount of the channel layer 231 may be controlled by using the elliptical shape of the opening 215 so that the channel layer 231 is deposited with different thicknesses based on the directions in which the major axis AX1 and the minor axis AX2 face. The thickness of the channel layer 231 may be defined as a distance between the outer wall 231_OW of the channel layer 231 and the inner wall 231_IW of the channel layer 231. Specifically, the channel layer 231 may include a portion having a first thickness D1, a portion having a second thickness D2, a portion having a third thickness D3, and a portion having a fourth thickness D4. The first thickness D1 may be defined as a thickness in the second direction DR2 in which the major axis AX1 faces the upper end of the opening 215, the second thickness D2 may be defined as a thickness in the third direction DR3 in which the minor axis AX2 faces the upper end of the opening 215, the third thickness D3 may be defined as a thickness in the second direction DR2 in which the major axis AX1 faces the lower end of the opening 215, and the fourth thickness D4 may be defined as a thickness in the third direction DR3 in which the minor axis AX2 faces the lower end of the opening 215. The deposition amount of the channel layer 231 may be controlled so that the first thickness D1 is greater than the second thickness D2 (D1>D2), and the third thickness D3 is greater than the fourth thickness D4 (D3>D4).

The channel layer 231 may be deposited by using a deposition method of which step coverage is low. As an embodiment, the channel layer 231 may be formed by inputting a deposition gas from the upper end of the opening 215 toward a lower portion, opposite to the first direction DR1. Accordingly, a deposition thickness of the channel layer 231 in the third direction DR3 in which the minor axis AX2 of the opening 215 faces may increase toward the upper end of the opening 215. In other words, the deposition thickness of the channel layer 231 in the third direction DR3 may decrease toward a lower direction, opposite to the first direction DR1, and thus, the channel layer 231 may have a tapered shape. Specifically, the second thickness D2 of the channel layer 231 may be greater than the fourth thickness D4 (D2>D4).

Because the opening 215 has the elliptical shape and is formed with a narrower width toward the lower end, the deposition thickness of the channel layer 231 in the third direction DR3 in which the major axis AX1 of the opening 215 faces may be controlled as in the following embodiments by controlling the deposition amount of the channel layer 231. As an embodiment, the deposition thickness of the channel layer 231 in the third direction DR3 may be the same at the upper end of the opening 215 and the lower end of the opening 215. As another embodiment, the deposition thickness of the channel layer 231 in the third direction DR3 may be greater at the upper end of the opening 215 than at the lower end of the opening 215. Specifically, the first thickness D1 of the channel layer 231 may be equal to or greater than the third thickness D3 (D1>D3). In the drawings below, although an embodiment in which the first thickness D1 is greater than the third thickness D3 is representatively shown, the present disclosure is not limited thereto. When the first thickness D1 is greater than the third thickness D3, an inclination angle θ2 of the inner wall 231_IW of the channel layer 231 may be defined to be greater than an inclination angle θ1 of the outer wall 231_OW of the channel layer 231 (θ2>θ1). The inclination angle θ1 of the outer wall 231_OW of the channel layer 231 and the inclination angle θ2 of the inner wall 231_IW of the channel layer 231 may be equal to or greater than 45° and equal to or less than 90°, and the inclination angle θ2 of the inner wall 231_IW of the channel layer 231 may be formed to be closer to 90° compared to the inclination angle θ1 of the outer wall 231_OW of the channel layer 231.

FIGS. 10A, 10B, 11A, 11B, 12A, 12B, 13, and 14 are diagrams illustrating various embodiments of processes following the process shown in FIGS. 9A to 9C.

Figure 10A:
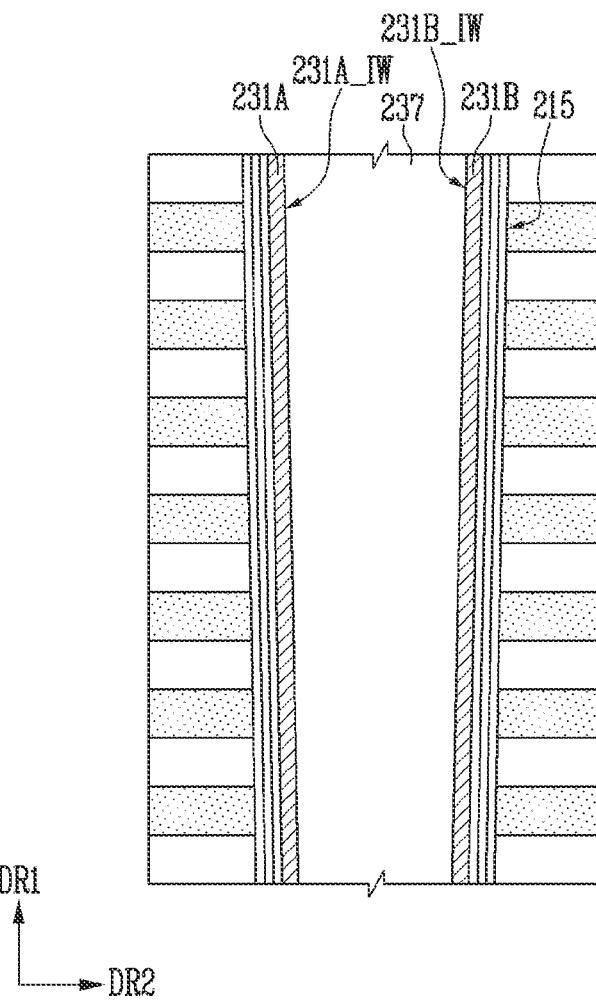
FIGS. 10A, 10B, 11A, 11B, 12A, 12B, 13, and 14 are diagrams illustrating various embodiments of processes following the process shown in FIGS. 9A to 9C.
Figure 10B:
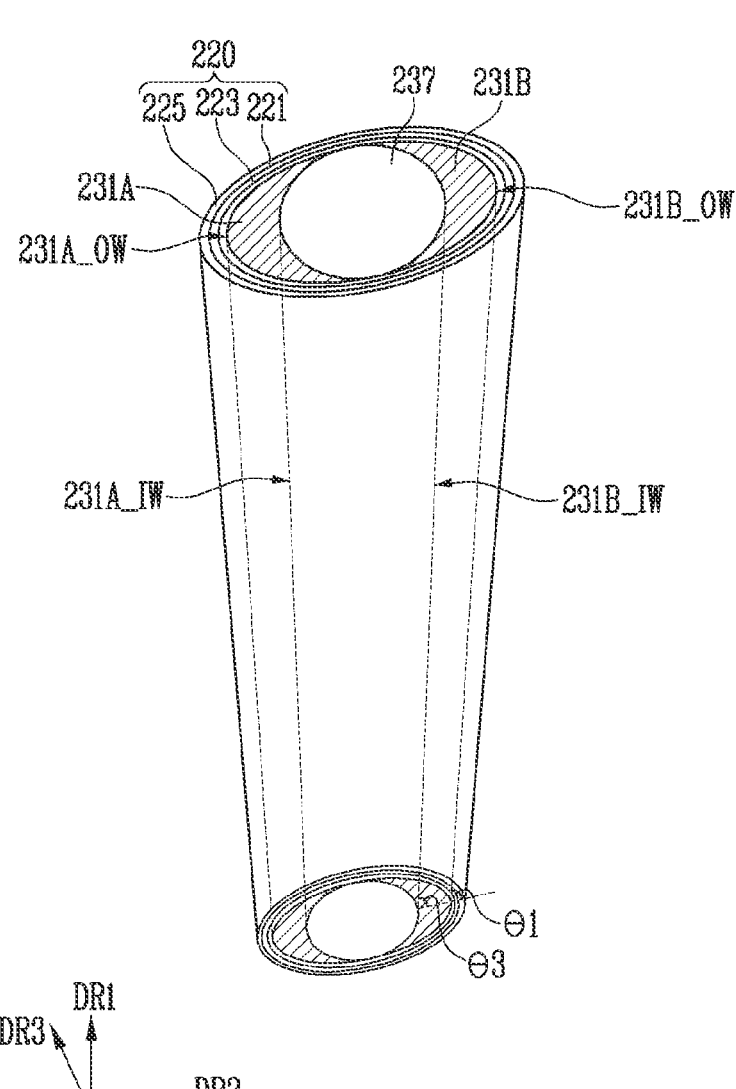

FIGS. 10A and 10B are diagrams illustrating a process of forming a first channel pattern and a second channel pattern and a process of forming a core insulating structure according to an embodiment of the present disclosure.

Referring to FIGS. 10A and 10B, the channel layer 231, shown in FIGS. 9A to 9C, may be separated into a first channel pattern 231A and a second channel pattern 231B, shown in FIGS. 9A to 9C, through the etching process of the channel layer 231, shown in FIGS. 9A to 9C. The first channel pattern 231A and the second channel pattern 231B may be spaced apart in the second direction DR2 within the opening 215, shown in FIGS. 9A and 9B.

The channel layer 231, shown in FIGS. 9A to 9C, may be etched through a wet etching process. During the wet etching process, an etching thickness may be controlled within a range that is less than the first thickness D1, described with reference to FIGS. 9A to 9C, and equal to or greater than the second thickness D2.

An etching amount of the channel layer 231, shown in FIGS. 9A to 9C, at the same level in the first direction DR1 may be different in a direction of the major axis AX1 of the opening 215, shown in FIGS. 9A to 9C, and a direction of the minor axis AX2 of the opening 215, shown in FIGS. 9A to 9C. This is because side areas of the channel layer 231 exposed to a wet etchant may be different in the first direction DR1 and the second direction DR2. More specifically, during the wet etching process, a loss amount of the first thickness D1 and the third thickness D3, shown in FIGS. 9A to 9C, may be less than that of the second thickness D2 and the fourth thickness D4.

According to the embodiment of the present disclosure described with reference to FIGS. 9A to 9C, the first thickness D1 and the third thickness D3 may be formed to be greater than the second thickness D2 and the fourth thickness D4. Accordingly, even though the wet etching process described with reference to FIGS. 10A and 10B is performed so that a portion of the channel layer 231 having the second thickness D2 and a portion of the channel layer 231 having the fourth thickness D4 are completely removed, a portion of the channel layer 231 having the first thickness D1, shown in FIGS. 9A to 9C, may remain as a portion of each of the first and second channel patterns 231A and 231B, and a portion of the channel layer 231 having the third thickness D3, shown in FIGS. 9A to 9C, may remain as a portion of each of the first and second channel patterns.

An etching amount according to a position difference of the channel layer 231 shown in FIGS. 9A to 9C in the first direction DR1 may be the same or different. As an embodiment, when the first thickness D1 is greater than the third thickness D3 in the channel layer 231 shown in FIGS. 9A and 9C, an upper end of the channel layer 231 may be etched relatively thicker than a lower end of the channel layer 231. As another embodiment, when the first thickness D1 is equal to the third thickness D3 in the channel layer 231, shown in FIGS. 9A and 9C, the upper end and the lower end of the channel layer 231 may be etched in substantially the same thickness.

As described above, through the control of the deposition thickness of the channel layer 231 described with reference to FIGS. 9A to 9C and the control of the etching amount of the channel layer 231 described with reference to FIGS. 10A and 10B, a thickness difference between portions of the channel pattern 231A or 231B disposed at different levels in the first direction DR1 may be reduced. Accordingly, a resistance difference between the portions of the channel pattern 231A or 231B disposed at the different levels in the first direction DR1 may be reduced, and thus, operation reliability of the semiconductor memory device may be improved.

An inner wall 231A_IW of the first channel pattern 231A and an inner wall 231B_IW of the second channel pattern 231B may face the central area of the opening 215. According to the embodiment in which the first thickness D1 is controlled to be greater than the third thickness D3 in the channel layer 231 shown in FIGS. 9A and 9C, due to a characteristic of the deposition process and the etching process of the channel layer 231 according to an embodiment of the present disclosure, an inclination angle θ3 of each of the inner wall 231A_IW of the first channel pattern 231A and the inner wall 231B_IW of the second channel pattern 231B may be defined to be less than the inclination angle θ2 of the inner wall 231_IW of the channel layer 231 described with reference to FIG. 9A.

Although not shown in the drawing, at least one of the blocking insulating layer 221, the data storage layer 223, and the tunnel insulating layer 225 of the memory layer 220 may be etched during the wet etching process described above between the first channel pattern 231A and the second channel pattern 231B. At this time, a portion of the first channel pattern 231A and the second channel pattern 231B may be lost from the outer wall 231A_OW of the first channel pattern 231A facing the memory layer 220 and the outer wall 231B_OW of the second channel pattern 231B. According to an embodiment of the present disclosure, each of the first channel pattern 231A and the second channel pattern 231B may be formed so that a central area is thicker than an end area. Accordingly, even though a portion of the memory layer 220 is etched and a portion of each of the first channel pattern 231A and the second channel pattern 231B is lost, a channel current in each of the first channel pattern 231A and the second channel pattern 231B may be secured because each of the first channel pattern 231A and the second channel pattern 231B may remain thick in the central area.

After forming the first channel pattern 231A and the second channel pattern 231B, the core insulating structure may be formed by filling the central area of the opening 215 with an insulating layer 237.

Figure 11A:
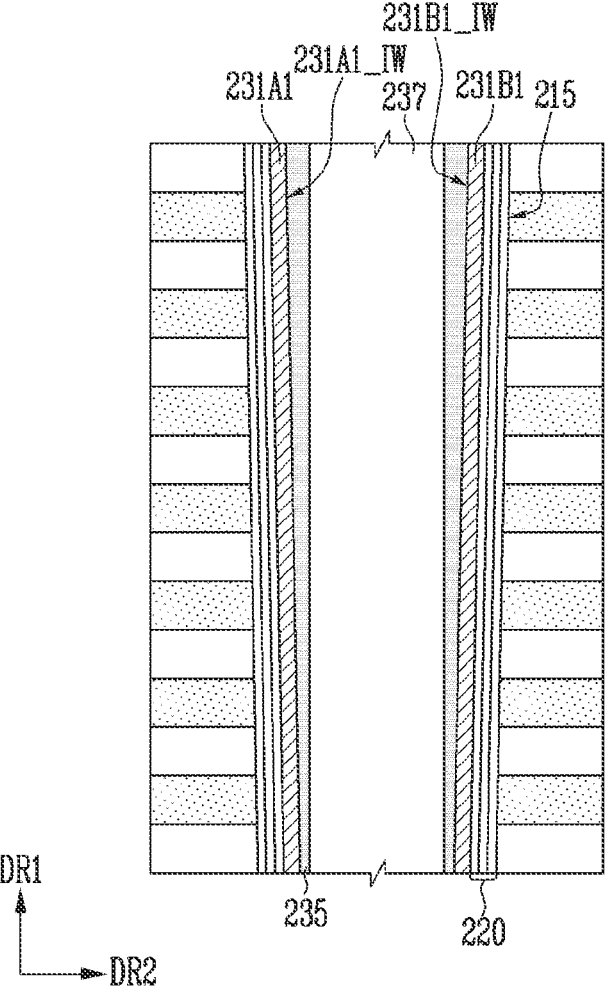
Figure 11B:
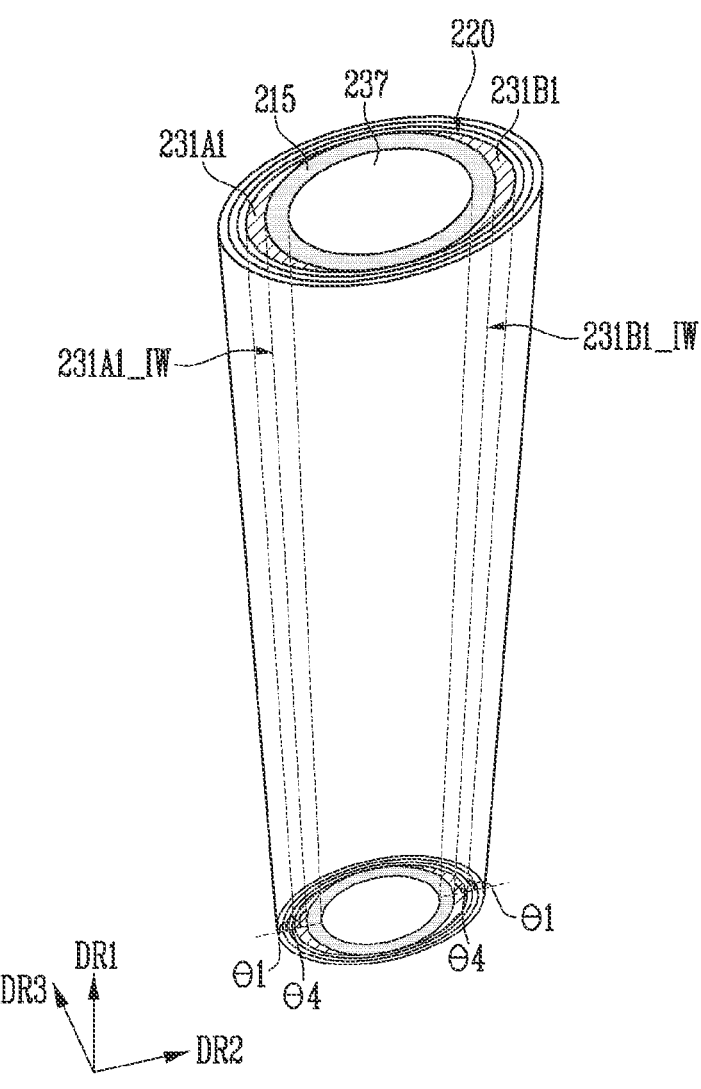

FIGS. 11A and 11B are diagrams illustrating a process of forming a first channel pattern and a second channel pattern and a process of forming a core insulating structure according to an embodiment of the present disclosure.

Referring to FIGS. 11A and 11B, the channel layer 231 shown in FIGS. 9A to 9C may be separated into a first channel pattern 231A1 and a second channel pattern 231B1 through an oxidation process of the channel layer 231, shown in FIGS. 9A to 9C. The first channel pattern 231A1 and the second channel pattern 231B1 may be spaced apart in the second direction DR2 within the opening 215, shown in FIGS. 9A and 9B.

During the oxidation process of the channel layer 231 shown in FIGS. 9A to 9C, an oxidation thickness may be controlled within a range less than the first thickness D1 described with reference to FIGS. 9A to 9C and equal to or greater than the second thickness D2.

An oxidation amount of the channel layer 231, shown in FIGS. 9A to 9C, at the same level in the first direction DR1 may be different in a direction of the major axis AX1 and a direction of the minor axis AX2 of the opening 215, shown in FIGS. 9A to 9C. This is because side areas of the channel layer 231 exposed to an oxidation gas may be different in the first direction DR1 and the second direction DR2. More specifically, during the oxidation process, a loss amount of the first thickness D1 and the third thickness D3, shown in FIGS. 9A to 9C, may be less than that of the second thickness D2 and the fourth thickness D4.

According to the embodiment of the present disclosure described with reference to FIGS. 9A to 9C, the first thickness D1 and the third thickness D3 may be formed to be greater than the second thickness D2 and the fourth thickness D4. Accordingly, even though the oxidation process described with reference to FIGS. 11A and 11B is performed so that a portion of the channel layer 231 having the second thickness D2 and a portion of the channel layer 231 having the fourth thickness D4 are completely oxidized, a portion of the channel layer 231 having the first thickness D1, shown in FIGS. 9A to 9C, may remain as a portion of each of the first and second channel patterns 231A1 and 231B1, and a portion of the channel layer 231 having the third thickness D3, shown in FIGS. 9A to 9C, may remain as a portion of each of the first and second channel patterns 231A1 and 231B1.

During the oxidation process, an oxidation thickness of the channel layer 231, shown in FIGS. 9A to 9C, may be the same or different according to a position in the first direction DR1. As an embodiment, when the first thickness D1 is greater than the third thickness D3 in the channel layer 231, shown in FIGS. 9A and 9C, an area in which the channel layer 231 is exposed to the oxidation gas may increase as the channel layer 231 is close to the upper end of the opening 215. Accordingly, an upper end of the channel layer 231 may be oxidized to be relatively thicker in proportion to the area exposed to the oxidation gas. As another embodiment, when the first thickness D1 is equal to the third thickness D3 in the channel layer 231, shown in FIGS. 9A and 9C, the upper end and the lower end of the channel layer 231 may be oxidized in substantially the same thickness.

As described above, through the control of the deposition thickness of the channel layer 231 described with reference to FIGS. 9A to 9C and the control of the oxidation amount of the channel layer 231 described with reference to FIGS. 11A and 11B, a thickness difference between portions of the channel pattern 231A1 or 231B1 disposed at different levels in the first direction DR1 may be reduced. Accordingly, a resistance difference between the portions of the channel pattern 231A1 or 231B1 disposed at the different levels in the first direction DR1 may be reduced, and thus, operation reliability of the semiconductor memory device may be improved.

According to the embodiment in which the first thickness D1 is controlled to be greater than the third thickness D3 in the channel layer 231, shown in FIGS. 9A and 9C, due to a characteristic of the deposition process and the oxidation process of the channel layer 231 according to an embodiment of the present disclosure, an inclination angle θ4 of each of an inner wall 231A1_IW of the first channel pattern 231A1 and an inner wall 231B1_IW of the second channel pattern 231B1 may be defined to be less than the inclination angle θ2 of the inner wall 231_IW of the channel layer 231 described with reference to FIG. 9A.

Each of the first channel pattern 231A1 and the second channel pattern 231B1 may be formed so that a central area is thicker than an end area. Accordingly, even though the channel layer is oxidized, a channel current in each of the first channel pattern 231A1 and the second channel pattern 231B1 may be secured because each of the first channel pattern 231A1 and the second channel pattern 231B1 may thickly remain in the central area.

After forming the first channel pattern 231A1 and the second channel pattern 231B1, the core insulating structure may be formed by filling the central area of the opening 215 with the insulating layer 237.

Figure 12A:
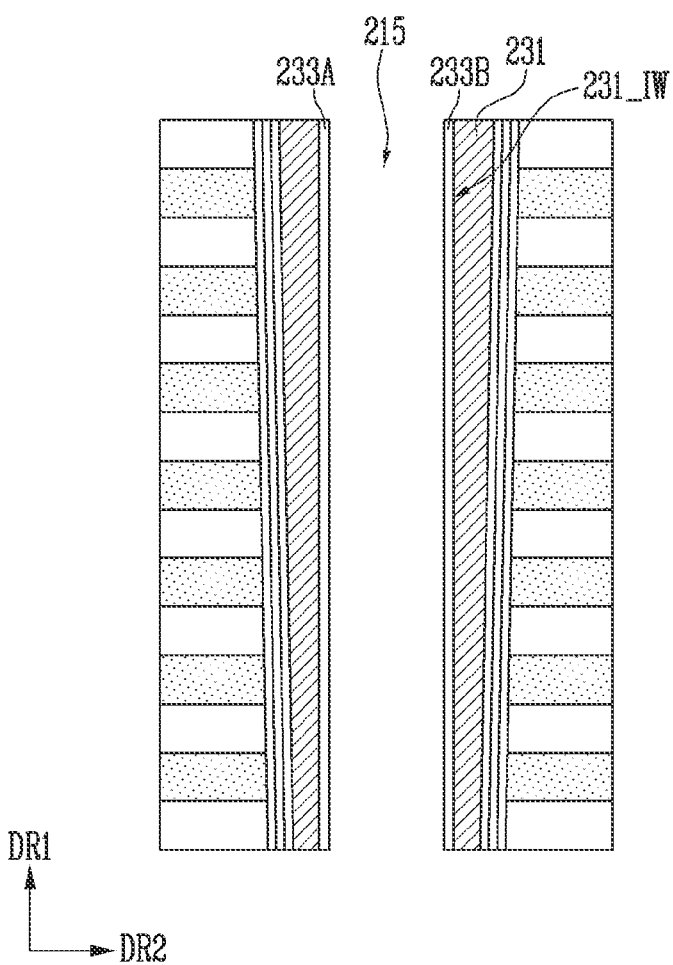
Figure 12B:
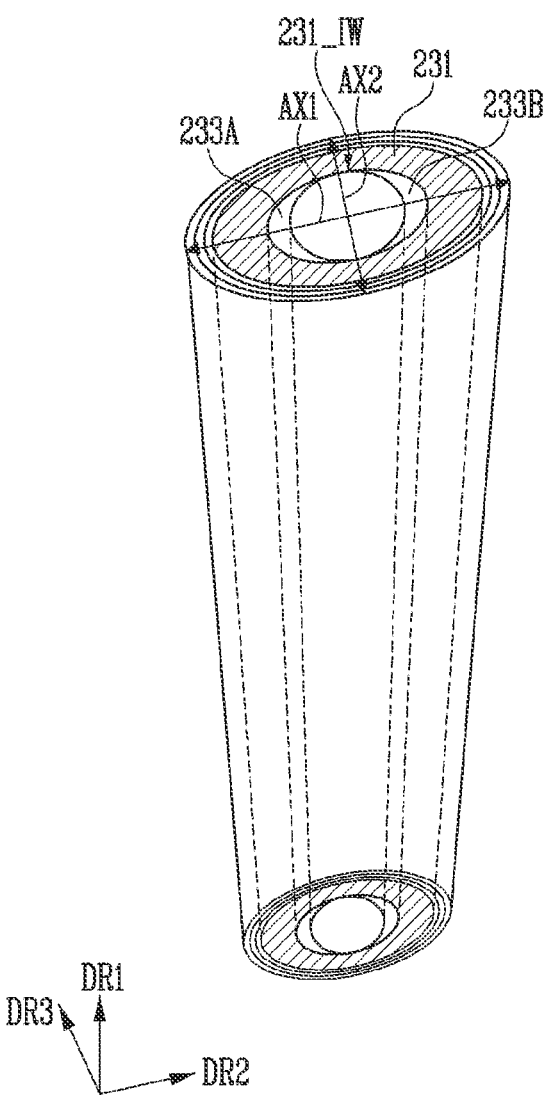

FIGS. 12A and 12B are diagrams illustrating a process of forming a first barrier insulating layer and a second barrier insulating layer.

Referring to FIGS. 12A and 12B, the first barrier insulating layer 233A and the second barrier insulating layer 233B may be formed before the wet etching process described with reference to FIGS. 10A and 10B or the oxidation process described with reference to FIGS. 11A and 11B.

Forming the first barrier insulating layer 233A and the second barrier insulating layer 233B may include forming an insulating layer along the inner wall 231_IW of the channel layer 231 toward the central area of the opening 215 and etching a portion of the insulating layer.

Similarly to the channel layer 231 described with reference to FIGS. 9A and 9B, the insulating layer may be deposited to have different thicknesses in the directions in which the major axis AX1 and the minor axis AX2 face. Specifically, the insulating layer may be relatively thickly deposited in the second direction DR2 compared to the third direction DR3. Thereafter, the insulating layer may be separated into the first barrier insulating layer 233A and the second barrier insulating layer 233B by etching the insulating layer using the etching method described with reference to FIGS. 10A and 10B.

The first barrier insulating layer 233A and the second barrier insulating layer 233B may be spaced apart in the second direction DR2 within the opening 215. A portion of the inner wall 231_IW of the channel layer 231 may be exposed between the first barrier insulating layer 233A and the second barrier insulating layer 233B.

Figure 13:
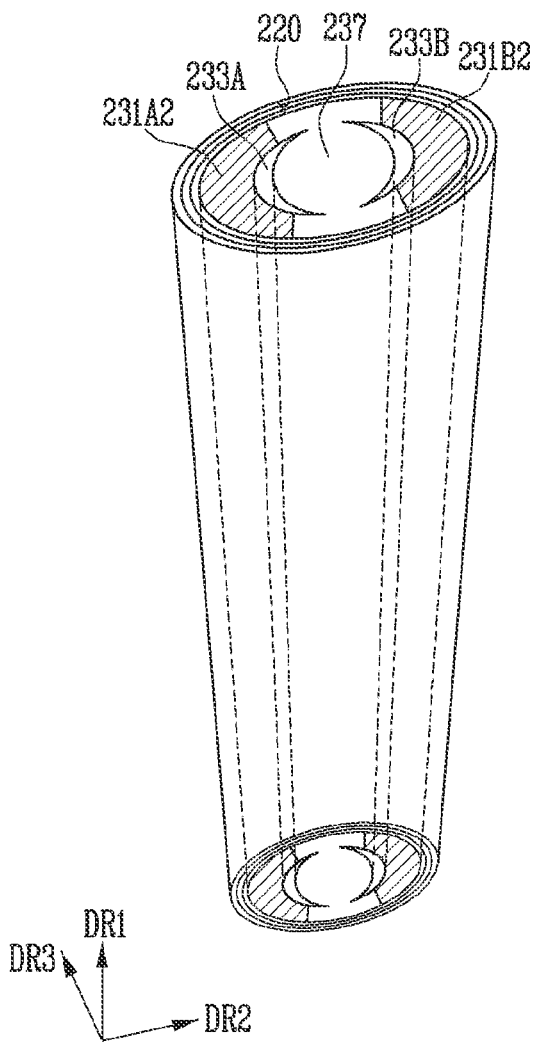

FIG. 13 is a perspective view illustrating an embodiment of a process following the process shown in FIGS. 12A and 12B.

Referring to FIG. 13, a portion of the channel layer 231 exposed between the first barrier insulating layer 233A and the second barrier insulating layer 233B, shown in FIG. 12B, may be removed through a wet etching process. Accordingly, the channel layer 231, shown in FIG. 12B, may be separated into a first channel pattern 231A2 and a second channel pattern 231B2.

Because the wet etching process may be performed by using the first barrier insulating layer 233A and the second barrier insulating layer 233B as an etch barrier, thickness loss of the first channel pattern 231A2 and the second channel pattern 231B2 may be reduced. In addition, because an end area of the first channel pattern 231A2 and the second channel pattern 231B2 may be formed in a blunt shape rather than a sharp shape, a phenomenon in which an electric field is concentrated at the end area of the first channel pattern 231A2 and the second channel pattern 231B2 may be improved.

By controlling an etching amount during the wet etching process, a portion of the channel layer between each of the first barrier insulating layer 233A and the second barrier insulating layer 233B and the memory layer 220 may be etched.

After the wet etching process, a remaining area of the opening may be filled with the insulating layer 237.

Figure 14:
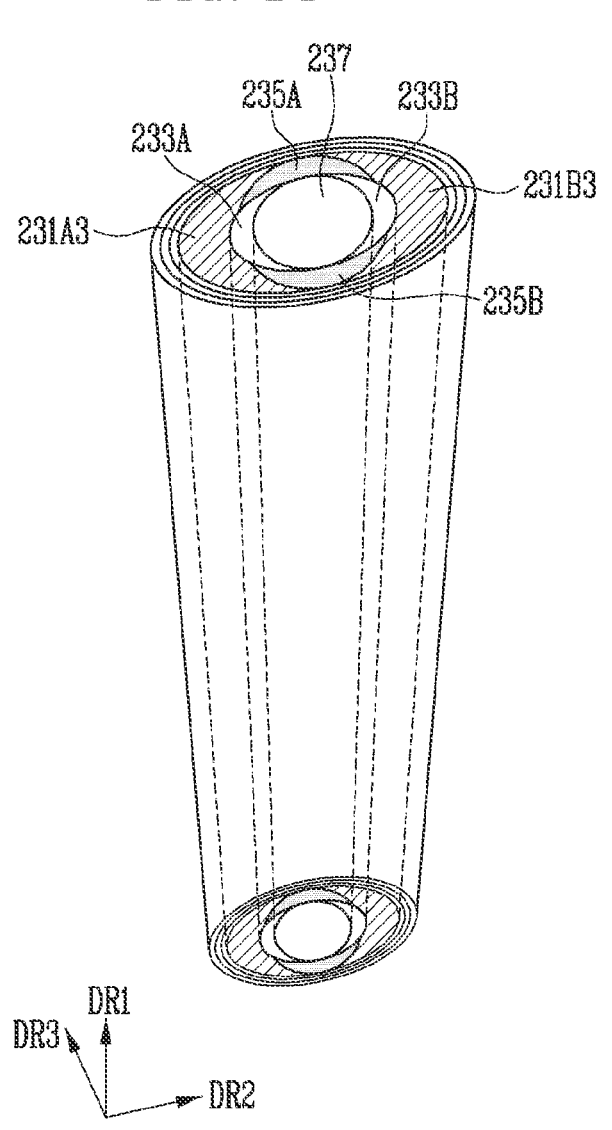

FIG. 14 is a perspective view illustrating an embodiment of a process following the process shown in FIGS. 12A and 12B.

Referring to FIG. 14, a portion of the channel layer 231 exposed between the first barrier insulating layer 233A and the second barrier insulating layer 233B, shown in FIG. 12B, may be oxidized. Accordingly, the channel layer 231, shown in FIG. 12B, may be separated into a first channel pattern 231A3 and a second channel pattern 231B3, and a first semiconductor oxide layer 235A or a second semiconductor oxide layer 235B may be formed between the first channel pattern 231A3 and the second channel pattern 231B3.

Because the oxidation process may be performed using the first barrier insulating layer 233A and the second barrier insulating layer 233B as an oxidation barrier, thickness loss of the first channel pattern 231A3 and the second channel pattern 231B3 may be reduced.

After the oxidation process, a remaining area of the opening may be filled with the insulating layer 237.

Figure 15:
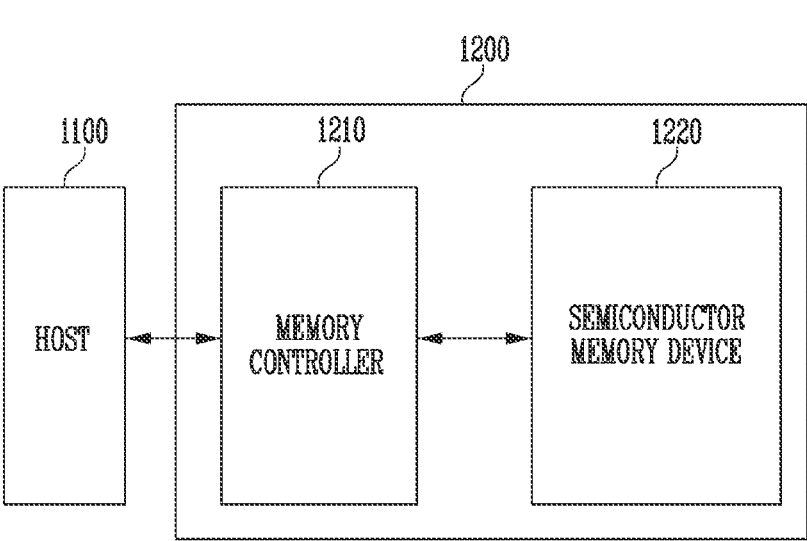
FIG. 15 is a block diagram illustrating an electronic system including a semiconductor memory device according to embodiments of the present disclosure.

FIG. 15 is a block diagram illustrating an electronic system including a semiconductor memory device according to embodiments of the present disclosure.

Referring to FIG. 15, the electronic system 1000 may be a computing system, a medical device, a communication device, a wearable device, a memory system, and the like. The electronic system 1000 may include a host 1100 and a storage device 1200.

The host 1100 may store data in the storage device 1200 or read data stored in the storage device 1200 based on an interface. The interface may include at least one of a double data rate (DDR) interface, a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer system interface (SCSI), an enhanced small disk interface (ESDI), integrated drive electronics (IDE) interface, a Firewire interface, a universal flash storage (UFS) interface, and a nonvolatile memory express (NVMe) interface.

The storage device 1200 may include a memory controller 1210 and a semiconductor memory device 1220. As an embodiment, the storage device 1200 may be a storage medium, such as a solid state drive (SSD) or a USB memory.

The memory controller 1210 may store data in the semiconductor memory device 1220 or read data stored in the semiconductor memory device 1220 under the control of the host 1100.

The semiconductor memory device 1220 may include one memory chip or a plurality of memory chips. The semiconductor memory device 1220 may store data or output stored data under control of the memory controller 1210.

The semiconductor memory device 1220 may be a nonvolatile memory device. The semiconductor memory device 1220 may include at least one of the semiconductor memory devices shown in FIGS. 3A and 3B. The semiconductor memory device 1220 may include at least one of the semiconductor memory devices, shown in FIGS. 4A and 4B. The semiconductor memory device 1220 may include the structure described with reference to FIGS. 5 and 6A to 6C or at least one of the structures, shown in FIGS. 7A to 7D. The semiconductor memory device 1220 may include at least one of the structures, shown in FIGS. 8A to 8C. As an example, the semiconductor memory device 1220 may include a stack including a plurality of conductive layers, an opening of an elliptical shape extending in a stack direction of conductive layers in the stack, and a first channel pattern and a second channel pattern spaced apart from each other in the opening of the elliptical shape. The first channel pattern and the second channel pattern of the semiconductor memory device 1220 may be spaced apart from each other in a direction in which a major axis of the elliptical shape faces, and a thickness of each of the first channel pattern and the second channel pattern may decrease as a distance from the major axis increases.

According to the present disclosure, because a thickness of the channel layer may be secured, operation reliability of the semiconductor memory device may be improved.

What is claimed is:

1. A semiconductor memory device comprising:
a stack including a plurality of conductive layers stacked to be spaced apart in a first direction;
an opening in the stack extending in the first direction and having an elliptical shape in a plan view;
a first channel pattern and a second channel pattern spaced apart from each other in a second direction toward which a major axis of the elliptical shape faces in the opening, the first channel pattern and the second channel pattern extending in the first direction; and a memory layer between the stack and each of the first channel pattern and the second channel pattern, wherein each of the first channel pattern and the second channel pattern includes a central portion overlapping with the major axis of the elliptical shape and a bent portion extending along an inner wall of the memory layer and extending away from the central portion, wherein a thickness of the bent portion of each of the first channel pattern and the second channel pattern decreases as a distance from the central portion increases, and wherein the plurality of conductive layers each extends continuously to surround the first channel pattern, the second channel pattern, and the memory layer.

2. The semiconductor memory device of claim 1, wherein each of the first channel pattern and the second channel pattern has a crescent shape in a plan view.

3. The semiconductor memory device of claim 1, wherein the bent portion of each of the first channel pattern and the second channel pattern has a sharp end.

4. The semiconductor memory device of claim 1, wherein the bent portion of each of the first channel pattern and the second channel pattern has a linear end.

5. The semiconductor memory device of claim 1, further comprising:

a core insulating structure disposed inside the opening between the first channel pattern and the second channel pattern.

6. The semiconductor memory device of claim 5, wherein the memory layer includes an area that is in contact with the core insulating structure.

7. The semiconductor memory device of claim 5, wherein the memory layer includes a blocking insulating layer between the stack and each of the first channel pattern and the second channel pattern, a data storage layer between the blocking insulating layer and each of the first channel pattern and the second channel pattern, and a tunnel insulating layer between the data storage layer and each of the first channel pattern and the second channel pattern, and wherein at least one of the blocking insulating layer, the data storage layer, and the tunnel insulating layer is penetrated by the core insulating structure.

8. The semiconductor memory device of claim 5, wherein the core insulating structure comprises:

an insulating pillar disposed in a central area of the opening; and a semiconductor oxide layer surrounding a sidewall of the insulating pillar.

9. The semiconductor memory device of claim 5, wherein the core insulating structure comprises:

an insulating pillar disposed in a central area of the opening, the insulating pillar extending to contact an end area of the bent portion of each of the first channel pattern and the second channel pattern; and a barrier insulating layer disposed between the insulating pillar and each of the first channel pattern and the second channel pattern, the barrier insulating layer having a crescent shape in a plan view.

10. The semiconductor memory device of claim 5, wherein the core insulating structure comprises:

an insulating pillar disposed in a central area of the opening;

a barrier insulating layer disposed between the insulating pillar and each of the first channel pattern and the second channel pattern, the barrier insulating layer having a crescent shape in a plan view; and a semiconductor oxide layer extending along a portion of a sidewall of the insulating pillar opened by the barrier insulating layer and extending between the barrier insulating layer and an end area of the bent portion of each of the first channel pattern and the second channel pattern.

* * * * *